United States Patent
Yoo et al.

(10) Patent No.: US 9,876,496 B2
(45) Date of Patent: Jan. 23, 2018

(54) RADIO FREQUENCY SWITCH CIRCUIT

(71) Applicant: SAMSUNG ELECTRO-MECHANICS CO., LTD., Suwon-si (KR)

(72) Inventors: Hyun Jin Yoo, Suwon-si (KR); Jong Myeong Kim, Suwon-si (KR); Yoo Hwan Kim, Suwon-si (KR); Hyun Hwan Yoo, Suwon-si (KR); Yoo Sam Na, Suwon-si (KR); Dae Seok Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/954,521

(22) Filed: Nov. 30, 2015

(65) Prior Publication Data
US 2016/0285449 A1    Sep. 29, 2016

(30) Foreign Application Priority Data
Mar. 25, 2015 (KR) .......................... 10-2015-0041617

(51) Int. Cl.
*H03K 17/687* (2006.01)
*H03K 17/693* (2006.01)

(52) U.S. Cl.
CPC ................. *H03K 17/693* (2013.01)

(58) Field of Classification Search
CPC .................. H03K 17/567; H03K 17/6872
See application file for complete search history.

(56) References Cited

U.S. PATENT DOCUMENTS

| | | | |
|---|---|---|---|
| 7,345,521 B2 | 3/2008 | Takahashi et al. | |
| 8,008,988 B1 | 8/2011 | Yang et al. | |
| 8,818,298 B2* | 8/2014 | Sugiura | H04B 1/401 333/103 |
| 9,035,716 B2* | 5/2015 | Tanji | H01P 1/15 327/427 |
| 9,276,570 B2* | 3/2016 | Madan | H03K 17/06 |
| 9,331,690 B2* | 5/2016 | Choi | H03K 17/6871 |
| 9,438,223 B2* | 9/2016 | de Jongh | H03K 17/161 |

* cited by examiner

*Primary Examiner* — Hai L Nguyen
(74) *Attorney, Agent, or Firm* — NSIP Law

(57) ABSTRACT

A radio frequency switch circuit, according to examples, includes a switching circuit controlled to be in a turned on or turned off state on the basis of a gate signal to thereby allow a radio frequency signal to pass or be blocked; a voltage dividing circuit connected to terminals of the switching circuit that the radio frequency signal passes through and outputting intermediate voltage between the terminals by a voltage dividing node; and an impedance circuit connected between the voltage dividing node and a body terminal of the switching circuit.

12 Claims, 22 Drawing Sheets

RADIO FREQUENCY SWITCH CIRCUIT

CROSS-REFERENCE TO RELATED APPLICATION(S)

This application claims the benefit of Korean Patent Application No. 10-2015-0041617 filed on Mar. 25, 2015 in the Korean Intellectual Property Office, the entire disclosure of which is incorporated herein by reference.

BACKGROUND

1. Field

The following description relates to a radio frequency switch circuit.

2. Description of Related Art

With the continuing development of wireless communications technology, the ability to undertake communications using multiple communications standards has been provided in a single device. For example, the latest mobile communication terminals, which may support communications using standards such as global system for mobile communications (GSM), code division multiple access (CDMA), universal mobile telecommunication system (UMTS), long term evolution (LTE), or similar standards, may support increasing numbers of bands to provide a user with the ability to handle increased data traffic and to improve device versatility.

A radio frequency switch (RF switch) may be used to support a plurality of bands. The radio frequency switch may change signal transmission and signal reception paths to a frequency band to be used among available several bands. By taking these steps, the radio frequency switch adapts to a particular band or bands and allows a device to adopt an approach that is appropriate for a desired communication session.

In this case, the RF switch is required to decrease insertion loss and increase a 1 dB gain compression point (P1 dB) when the RF switch is in a transmission mode. Further, the RF switch is required to decrease a noise figure when it is in a reception mode. In addition, as a large number of frequency bands are present and an interval between the frequencies becomes significantly small, linearity characteristics in RF switches, such as inter-modulation distortion (IMD) characteristics, have been increasing in importance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples discussed in the present disclosure provide a radio frequency switch circuit.

In one general aspect, a radio frequency switch circuit, includes a first switch circuit connected between a signal port and an antenna port and operated by a gate signal, wherein the first switch circuit includes a switching circuit controlled to be in a turned on or turned off state on the basis of the gate signal to thereby allow a radio frequency signal to pass or be blocked, a voltage dividing circuit connected to terminals of the switching unit that the radio frequency signal passes through and configured to output intermediate voltage between the terminals by a voltage dividing node, and an impedance circuit connected between the voltage dividing node and a body terminal of the switching circuit.

The voltage dividing circuit may include a first resistor and a second resistor connected to each other in series, and the first resistor and the second resistor may have different levels of resistance.

The impedance circuit may include a body capacitor connected between a node between the first resistor and the second resistor and the body terminal of the switching circuit.

The switching circuit may include first switches connected to each other in series, and the impedance circuit may be connected between the voltage dividing node of the voltage dividing circuit and a body terminal of a first switch of the first switches.

The first switches may include field effect transistors (FETs) connected to each other in series through source terminals and drain terminals of the FETs, gate resistors connected to gate terminals of the FETs, respectively, and body resistors connected to body terminals of the FETs, respectively.

A first switch of the first switches that is connected to the impedance circuit may be provided in a position closer to the antenna port as compared to a first switch of the first switches that is not connected to the impedance circuit.

The radio frequency switch circuit may further include a second switch circuit connected between the signal port and a ground and operated by a second gate signal, including a second switching circuit, wherein the second switching circuit is controlled to be in a turned on or turned off state on the basis of the second gate signal to allow the radio frequency signal to pass or be blocked.

The second switch circuit may further include a second voltage dividing circuit connected to terminals through which the radio frequency signal from the second switching circuit passes, and a second impedance unit connected between a voltage dividing node of the second voltage dividing circuit and a body terminal of the second switching circuit.

The second switching circuit may include second switches connected to each other in series, and the second switch circuit may further include a second voltage dividing circuit connected between terminals through which the radio frequency signal from the second switches passes, and a second impedance circuit connected between a voltage dividing node of the second voltage dividing circuit and a body terminal of a second switch of the second switches.

In another general aspect, a radio frequency switch circuit includes a first switch circuit connected between a signal port and an antenna port and operated by a first gate signal, and a second switch circuit connected between the signal port and a ground and operated by a second gate signal, wherein the second switch circuit including a second switching circuit controlled to be in a turned on or turned off state on the basis of the second gate signal to thereby allow a radio frequency signal to pass or be blocked, a second voltage dividing circuit connected to terminals of the second switching unit which the radio frequency signal passes through and outputting intermediate voltage between the terminals by a voltage dividing node, and a second impedance circuit connected between the voltage dividing node and a body terminal of the second switching circuit.

The second voltage dividing circuit may include a first inductor and a second inductor connected to each other in series and having different levels of inductance, and the second impedance circuit may include a body capacitor connected between a node between the first inductor and the second inductor and the body terminal of the second switching circuit.

The second switching circuit may include second switches connected to each other in series, and the second impedance circuit may be connected between the voltage dividing node of the second voltage dividing circuit and a body terminal of a second switch of the second switches.

The first switches may include field effect transistors (FETs) connected to each other in series through source terminals and drain terminals of the FETs, gate resistors connected to gate terminals of the FETs, respectively, and body resistors connected to body terminals of the FETs, respectively.

A second switch of the second switches that is connected to the second impedance circuit may be provided in a position closer to the signal port as compared with a second switch of the second switches that is not connected to the second impedance circuit.

The second voltage dividing circuit may include variable impedance switches connected to each other in series and having levels of impedance changed by a control signal, and the second impedance circuit may include a body capacitor connected between a node between the variable impedance switches and the body terminal of the switching circuit.

Also, according to another example, a radio frequency switch circuit may include a first switch circuit unit connected between a first signal port for transmitting and receiving a first signal and a common connection node connected to an antenna port, a second switch circuit unit connected between the first signal port and a ground, a third switch circuit unit connected between a second signal port for transmitting and receiving a second signal and the common connection node, a fourth switch circuit unit connected between the second signal port and the ground.

At least one of the first switch circuit unit, the second switch circuit unit, the third switch circuit unit, and the fourth switch circuit unit may include a switching unit controlled to be in a turned on or turned off state on the basis of a gate signal to thereby allow a radio frequency signal to pass or be blocked, a voltage dividing unit connected to terminals through which the radio frequency signal from the switching unit passes, and an impedance unit connected between a voltage dividing node of the voltage dividing unit and a body terminal of the switching unit.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
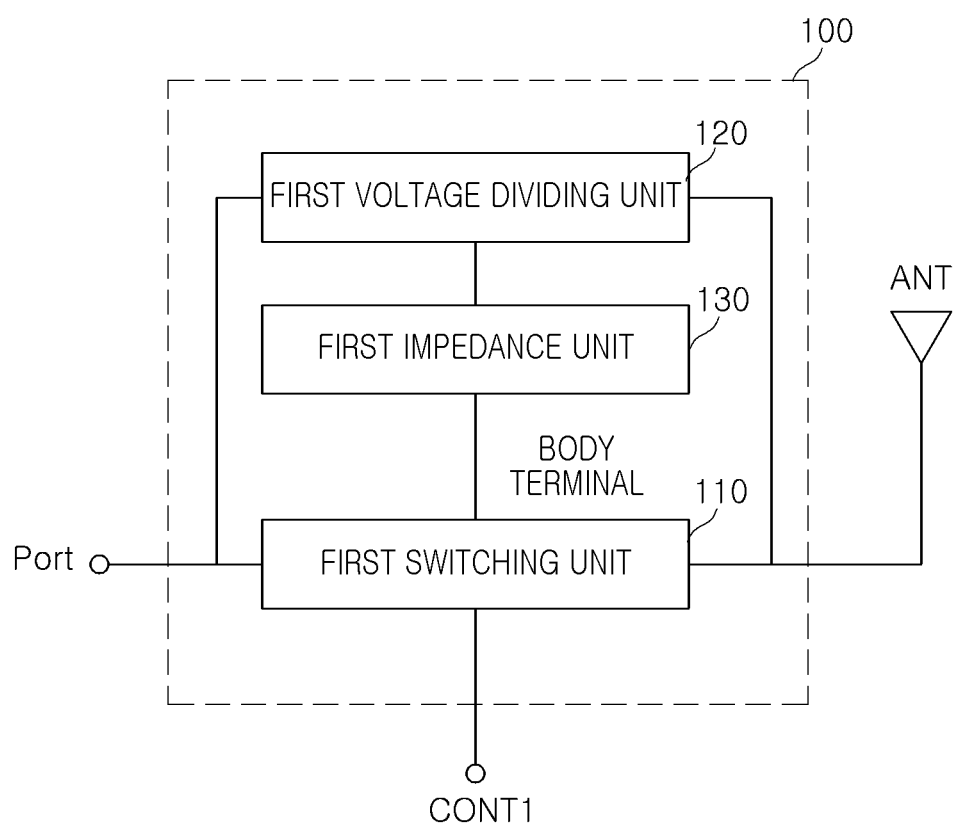
FIG. 1 is a diagram illustrating a radio frequency switch circuit according to an example of the present disclosure.

FIG. 1 is a diagram illustrating a radio frequency switch circuit according to an example of the present disclosure.

Referring to the example of FIG. 1, a radio frequency switch circuit 1 according to an example includes a first switch circuit unit 100, and the first switch circuit unit 100 includes a first switching unit 110, a first voltage dividing unit 120, and a first impedance unit 130.

In this example, the first switch circuit unit 100 is connected between a signal port for transmitting and receiving a signal and a common connection node connected to an antenna port ANT and is thus operated based upon a first gate signal CONT1.

For example, when a value of the first gate signal CONT1 is high, the first switch circuit unit 100 is placed in a turned on state such that the radio frequency signal is able to pass. However, when the value of the first gate signal CONT1 is low, the first switch circuit unit 100 is placed in a turned off state such that the radio frequency signal is blocked.

For example, the first switch circuit unit 100 is in a turned on state in case of a transmission and reception mode and is in a turned off state in case of an isolation mode. Here, the transmission and reception mode refers to a state in which a radio frequency signal is transmitted and received through the signal port and the antenna port ANT. Further, the isolation mode refers to a state in which a radio frequency signal is not transmitted and received through the signal port and the antenna port ANT.

The first switching unit 110 is controlled to be in a turned on or turned off state depending on the first gate signal CONT1, such that a signal may pass or be blocked as discussed above.

In this example, the first voltage dividing unit 120 is connected between terminals, through which the radio frequency signal from the first switching unit 100 passes, to divide a voltage. Here, the voltage divided by the first voltage dividing unit 120 is changed depending on a change in respective voltages of the terminals through which the radio frequency signal from the first switching unit 110 passes.

The first impedance unit 130 is connected between a voltage dividing node of the first voltage dividing unit 120 and a body terminal of the first switching unit 110. Thus, in this example, the body terminal of the first switching unit 110 is affected by an impedance of the first impedance unit 130.

As a result, by use of this approach, a difference in parasitic impedance between the body terminal of the first switching unit 110 and two terminals through which the radio frequency signal from the first switching unit 100 passes is compensated. Furthermore, an effect of a leakage current flowing in the body terminal of the first switching unit 110 on the radio frequency signal is decreased. Therefore, in this example, by using these techniques, linearity characteristics of the radio frequency switch circuit 1 are improved.

Meanwhile, the gate signal described above is provided by an internal control circuit of the radio frequency switch circuit 1 according to the example and is received by a corresponding external control circuit. Here, the internal control circuit and/or the external control circuit act to process a signal in an analog or a digital manner. In different examples, the internal control circuit and/or the external control circuit potentially include, for example, a central processing unit (CPU), a graphic processing unit (GPU), a microprocessor, an application specific integrated circuit (ASIC), field programmable gate arrays (FPGA), or similar elements and potentially have a plurality of cores. Through the previously mentioned configurations, the passage of a signal through respective units included in the radio frequency switch circuit 1 is controlled and an operation mode of the radio frequency switch circuit 1 is controlled.

Figure 2:
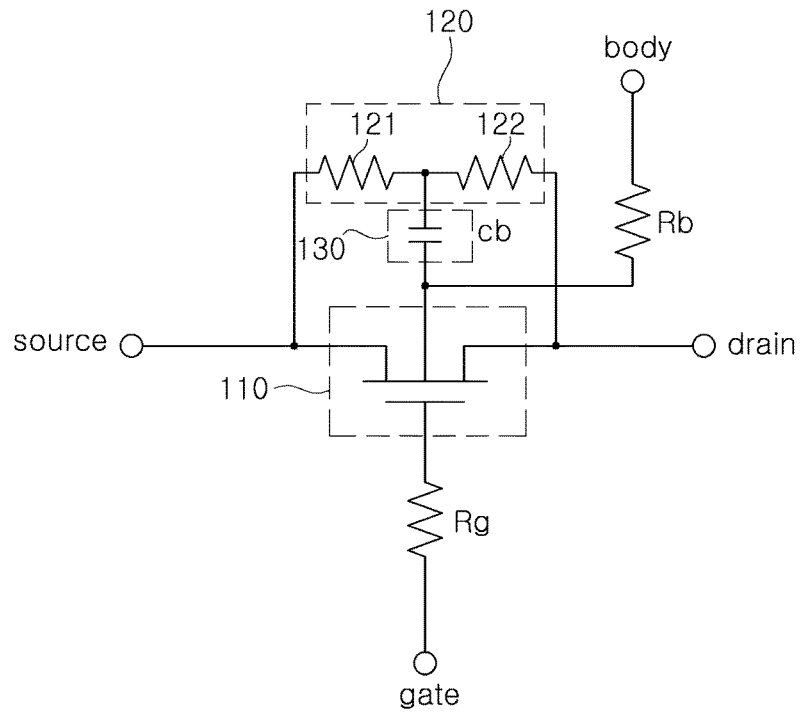
FIG. 2 is a circuit diagram illustrating a first switch circuit unit of the example of FIG. 1.

FIG. 2 is a circuit diagram illustrating a first switch circuit unit of the example of FIG. 1.

Referring to the example of FIG. 2, the first voltage dividing unit 120 includes a first resistor 121 and a second resistor 122 that are connected to each other in series. Here, the resistance of the first resistor 121 and the resistance of the second resistor 122 are possibly asymmetrical.

As a result, the difference in parasitic impedance between the body terminal of the first switching unit 110 and two terminals through which the radio frequency signal from the first switching unit 100 passes is compensated for more accurately.

Referring to the example of FIG. 2, the first impedance unit 130 includes a body capacitor Cb connected between a node between the first resistor 121 and the second resistor 122 and the body terminal of the first switching unit 110.

Thus, by using this approach, phase difference distortion between the two terminals through which the radio frequency signal from the first switching unit 100 passes is decreased. Furthermore, the effect of the leakage current flowing in the body terminal of the first switching unit 110 on the radio frequency signal is also decreased.

Figure 3:
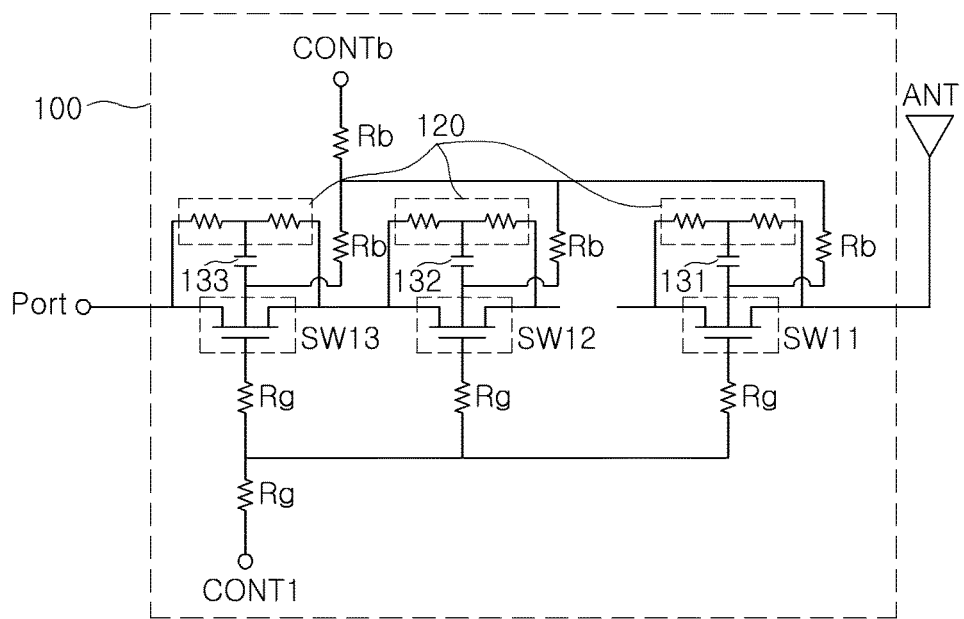
FIG. 3 is a circuit diagram illustrating the example radio frequency switch circuit including a plurality of first switches.

FIG. 3 is a circuit diagram illustrating the radio frequency switch circuit including a plurality of first switches.

Referring to the example of FIG. 3, the first switch circuit unit 100 includes a plurality of field effect transistors (FETs), a plurality of gate resistors Rg, and a plurality of body resistors Rb.

For example, the FETs of the plurality of FETs are connected to each other through their source terminals and drain terminals. In various examples, the number of field effect transistors of the plurality of FETs is changed depending on energy coverage of the radio frequency signal passing through the first switch circuit unit 100 and/or a breakdown voltage of the FETs.

In this example, the gate resistors of the plurality of gate resistors Rg are each connected to a gate terminal of the plurality of field effect transistors (FETs). The body resistors of the plurality of body resistors Rb are connected to body terminals of the plurality of field effect transistors (FETs), respectively.

Here, resistances of the gate resistors of the plurality of gate resistors Rg and resistances of the body resistors of the plurality of body resistors Rb are determined according to a relationship using an RC time constant for the circuit on the basis of parasitic capacitance. An RC time constant is the product of the circuit resistance and the circuit capacitance. For example, as the resistances of the gate resistors of the plurality of gate resistors Rg and the resistances of the body resistors of the plurality of body resistors Rb are increased, the power loss and isolation are accordingly reduced in first switching units SW11, SW12, and SW13.

Figure 4:
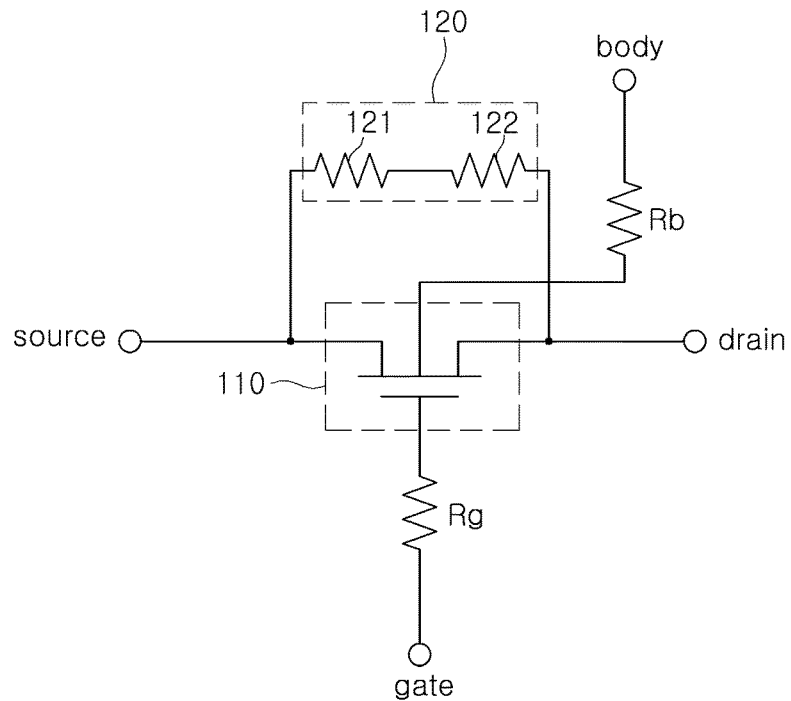
FIG. 4 is a circuit diagram illustrating a first switch that is not connected to a first impedance unit among the plurality of first switches.

FIG. 4 is a circuit diagram illustrating a first switch that is not connected to a first impedance unit among the plurality of first switches.

Referring to the example of FIG. 4, a radio frequency switch circuit according to an example also includes the first switch that is not connected to the first impedance unit. That is, such a radio frequency switch circuit includes not only the first switch that is connected to the first impedance unit, but also the first switch that is not connected to the first impedance unit.

Figure 5:
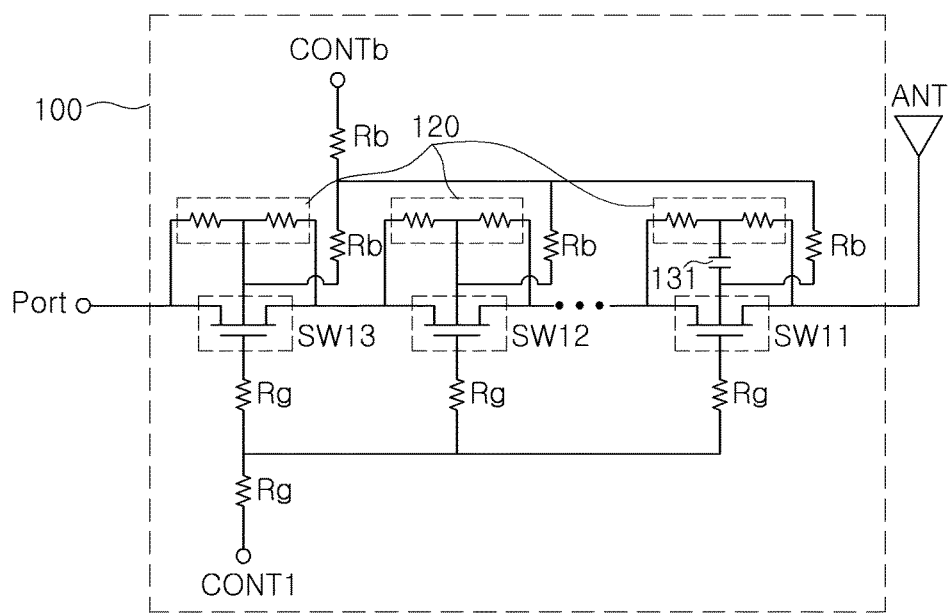
FIG. 5 is a circuit diagram illustrating a radio frequency switch circuit including a first switch that is connected to a first impedance unit and a first switch that is not connected to a first impedance unit.

FIG. 5 is a circuit diagram illustrating a radio frequency switch circuit including a first switch that is connected to a first impedance unit and a first switch that is not connected to the first impedance unit.

Referring to the example of FIG. 5, the first switch circuit unit 100 includes at least two first switches such as SW11, SW12, and SW13 connected to each other in series. In the example of FIG. 5, an example included three first switches is illustrated, but in other examples any appropriate number of switches that is two or greater may be used. In this example, a first impedance unit 131 is connected between a voltage dividing node of the first voltage dividing unit 120 and a body terminal of the first switch SW11 of the at least two first switches SW11, SW12, and SW13.

For example, the first switch circuit unit 100 includes the first switch illustrated in FIG. 2 and the first switch illustrated in FIG. 4.

Further, in the first switch circuit unit 100, a ratio of the number of first switches that are connected to the first impedance unit 131 and the number of first switches that are not connected to the first impedance unit 131 is changed depending on the communications standards supported by the radio frequency switch circuit 1. For example, when a third inter-modulation distortion (IMD3) in the communications standards supported by the radio frequency switch circuit 1 is significant, the quantity of first switches connected to the first impedance unit 131 is high in the first switch circuit unit 100. For example, when a second inter-modulation distortion (IMD2) in the communications standards supported by the radio frequency switch circuit 1 is significant, the quantity of first switches connected to the first impedance unit 131 is low in the first switch circuit unit 100.

Meanwhile, in this example, the first switch SW11 connected to the first impedance unit is connected to the first impedance unit in a position closer to the common connection node connected to the antenna port ANT, as compared with the first switches SW12 and SW13 that are not connected to the first impedance unit. Thus, the linearity characteristics of the radio frequency switch circuit 1 are efficiently improved in terms of circuit complexity or costs by using this approach.

Figure 6:
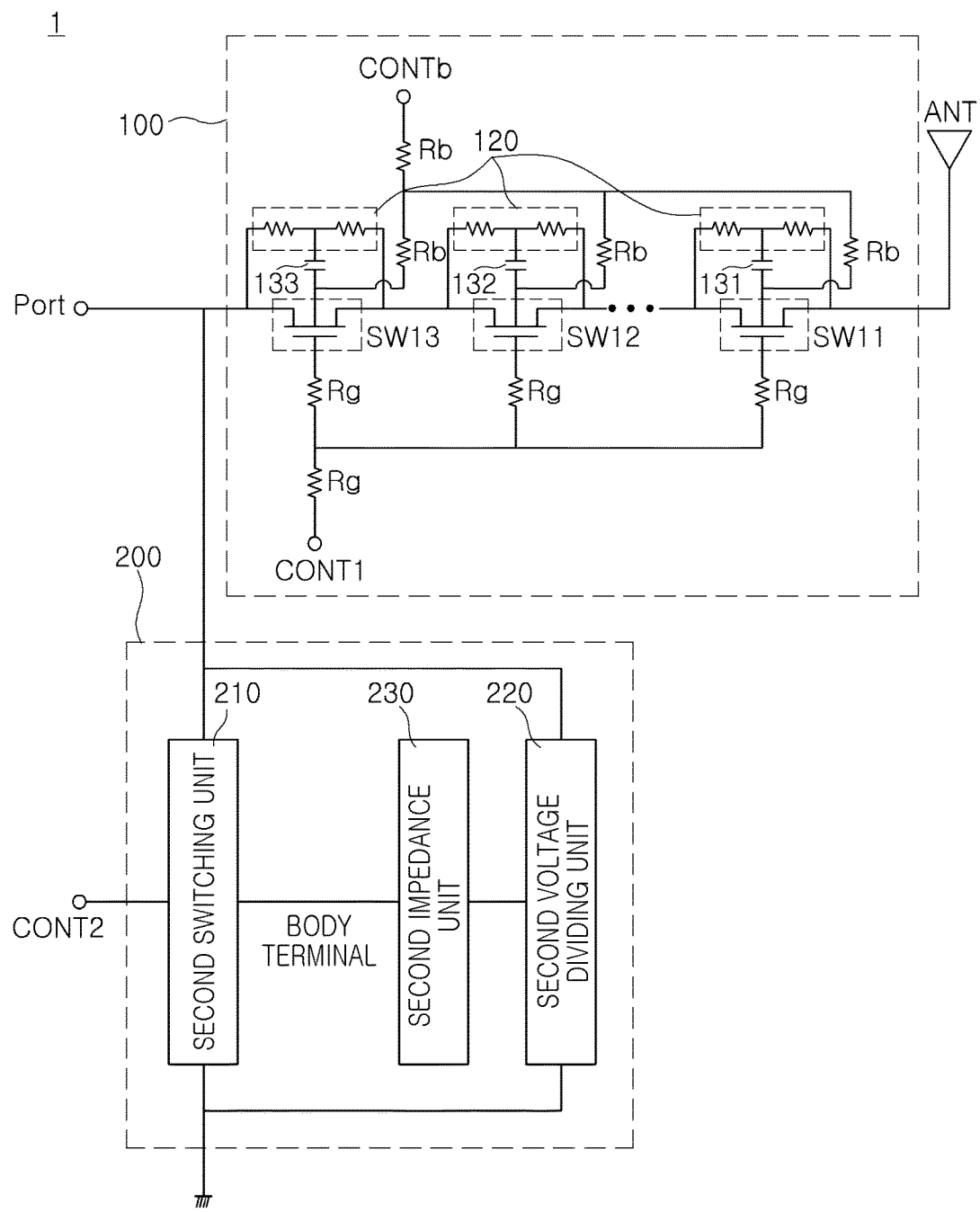
FIG. 6 is a diagram illustrating a radio frequency switch circuit including a second switch circuit unit.

FIG. 6 is a diagram illustrating a radio frequency switch circuit including a second switch circuit unit.

Referring to the example of FIG. 6, the radio frequency switch circuit 1 according to an example includes the first switch circuit unit 100 and a second switch circuit unit 200. In this configuration, the second switch circuit unit 200 includes a second switching unit 210, a second voltage dividing unit 220, and a second impedance unit 230.

In this example, the second switch circuit unit 200 is connected between a signal port and a ground and is operated based on a second gate signal CONT2.

For example, when the first switch circuit unit 100 is operated in a transmission and reception mode, the second switch circuit unit 200 is controlled to be in a turned off state so as to prevent signal loss from occurring due to the transmitted and received radio frequency signal flowing into the ground, thereby blocking the radio frequency signal.

For example, when the first switch circuit unit 100 is operated in an isolation mode, the second switch circuit unit 200 is controlled to be in a turned on state so as to reinforce the isolation of the signal port, thereby allowing the radio frequency signal to pass through the ground.

Here, the transmission and reception mode is a state in which the radio frequency signal is transmitted and received through the signal port and the antenna port ANT. Accordingly, the isolation mode is a state in which the radio frequency signal is not transmitted and received through the signal port and the antenna port ANT.

The second switching unit 210 is controlled to be in the turned on or turned off state depending on the second gate signal CONT2, such that a signal passes through or is blocked, accordingly.

The second voltage dividing unit 220 is connected between terminals through which the radio frequency signal from the second switching unit 210 passes. In this example, the voltage divided by the second voltage dividing unit 220 is changed depending on a change in respective voltages of the terminals through which the radio frequency signal from the second switching unit 210 passes.

Also, in this example, the second impedance unit 230 is connected between a voltage dividing node of the second voltage dividing unit 220 and a body terminal of the second switching unit 210. Here, the body terminal of the second switching unit 210 is affected by an impedance of the second impedance unit 230.

As a result, a difference in parasitic impedance between the body terminal of the second switching unit 210 and two terminals through which the radio frequency signal from the second switching unit 210 passes is potentially compensated for. Furthermore, an effect of a leakage current flowing in the body terminal of the second switching unit 210 on the radio frequency signal is potentially decreased.

In general, the second switch circuit unit 200 that is in a turned off state affects the linearity of the radio frequency signal passing through the first switch circuit unit 100 that is in a turned on state. In an example, the second switch circuit unit 200 that is in a turned off state is slightly turned on due to a high input power of the radio frequency signal in the terminal through which the radio frequency signal passes.

However, the second switch circuit unit 200 included in the radio frequency switch circuit 1 according to the example reduces an effect on the radio frequency signal passing through the first switch circuit unit 100 at the moment when the second switch circuit unit 200 is slightly turned on. Therefore, the linearity characteristics of the radio frequency switch circuit 1 are improved.

Figure 7:
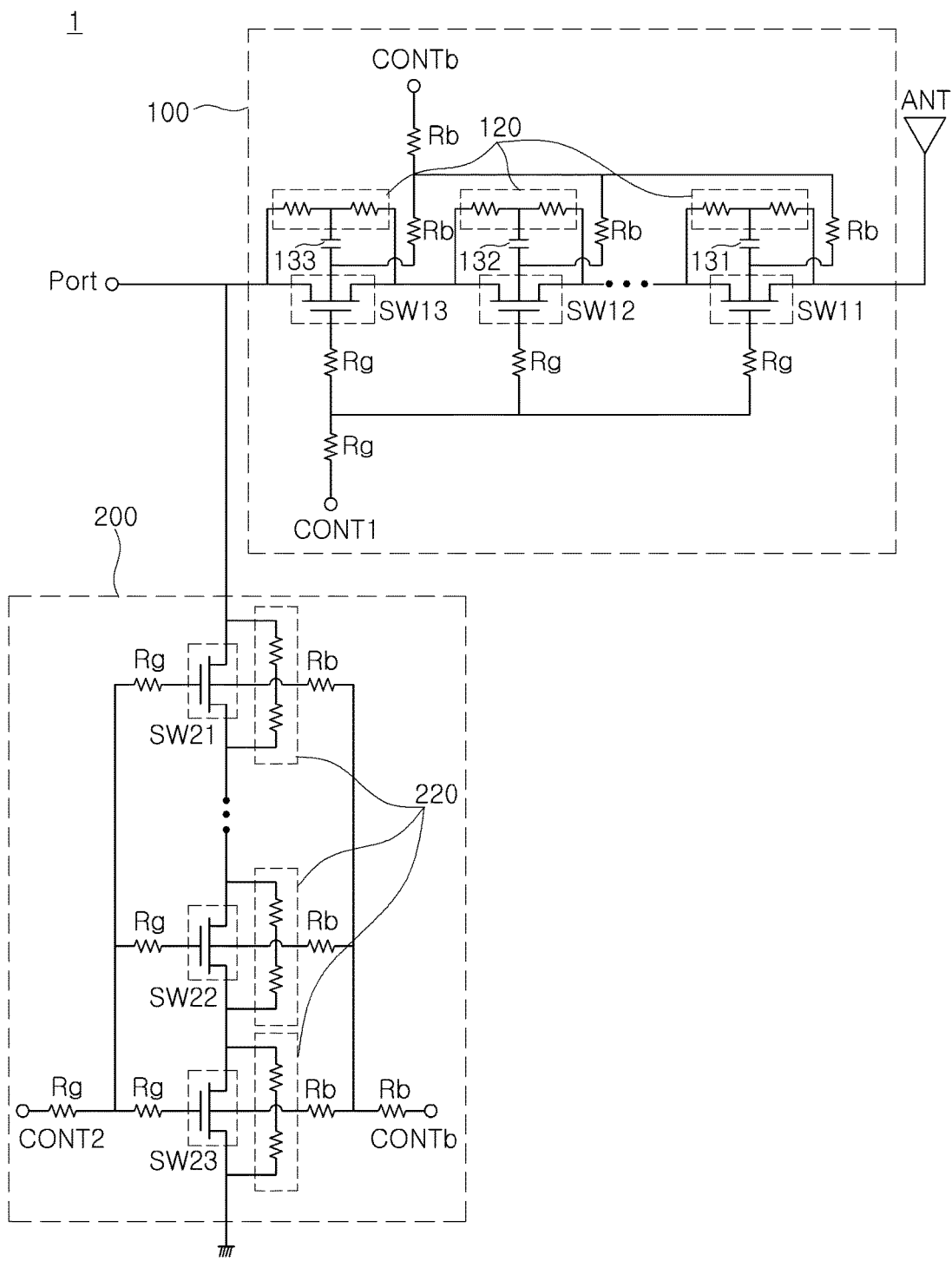
FIG. 7 is a circuit diagram illustrating a radio frequency switch circuit including a second switch that is not connected to a second impedance unit.

FIG. 7 is a circuit diagram illustrating a radio frequency switch circuit including a second switch that is not connected to a second impedance unit.

Referring to the example of FIG. 7, the first switch circuit unit 100 includes the first switches SW11, SW12, and SW13 connected to first impedance units 131, 132, and 133, but the second switch circuit unit 200 does not include second switches connected to second impedance units 231, 232, and 233. That is, in the example of FIG. 7, the switch connected to the impedance unit is not required to be included in both the first switch circuit unit 100 and the second switch circuit unit 200.

Figure 8:
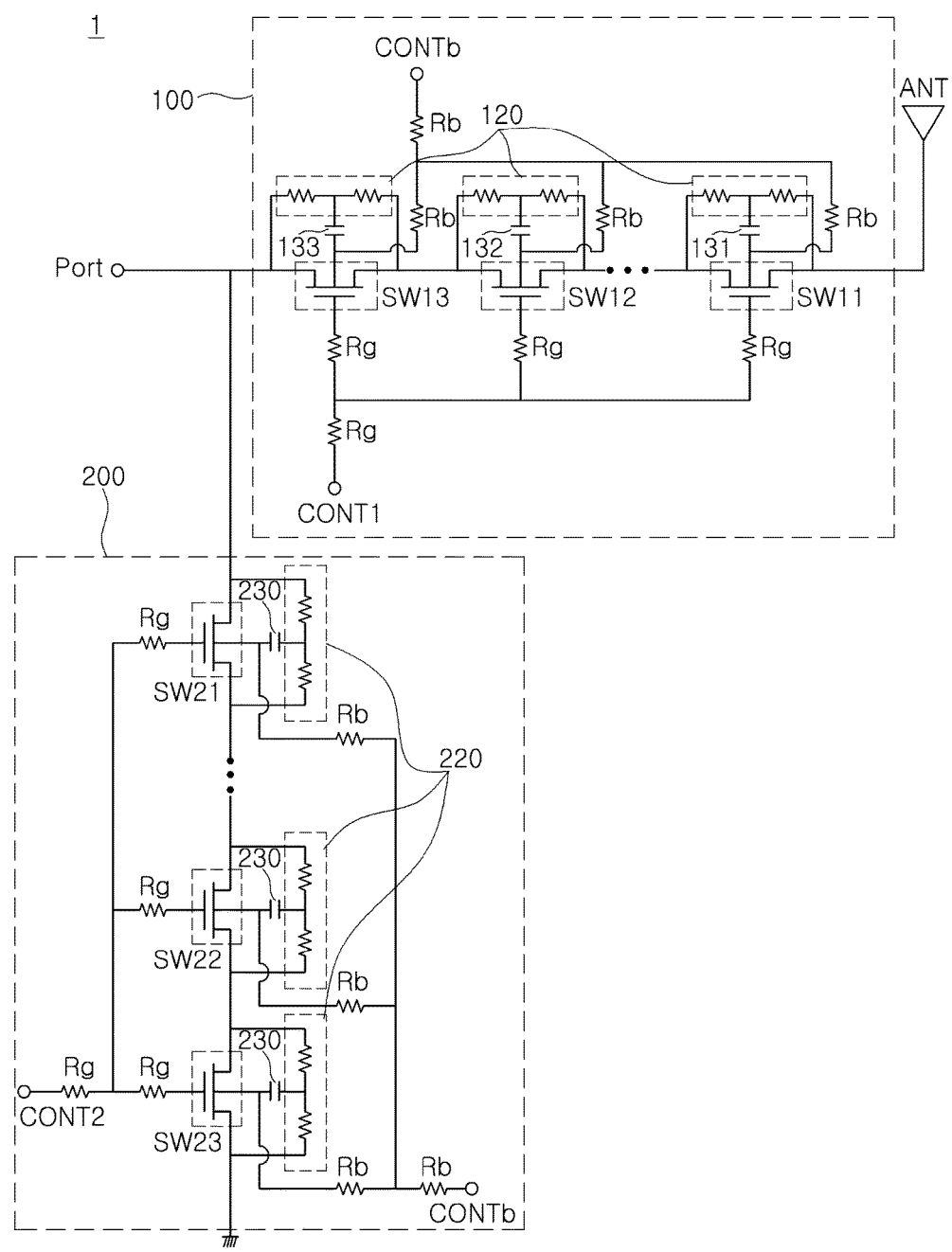
FIG. 8 is a circuit diagram illustrating a radio frequency switch circuit including a second switch that is connected to a second impedance unit.

FIG. 8 is a circuit diagram illustrating a radio frequency switch circuit including a second switch that is connected to a second impedance unit.

Referring to the example of FIG. 8, the first switch circuit unit 100 includes the first switches SW11, SW12, and SW13 connected to the first impedance unit and the second switch circuit unit 200 does not include second switches SW21, SW22, and SW23 connected to the second impedance units. That is, in the example of FIG. 8, the switch which is not connected to the impedance unit is not required be included in both the first switch circuit unit 100 and the second switch circuit unit 200.

Figure 9:
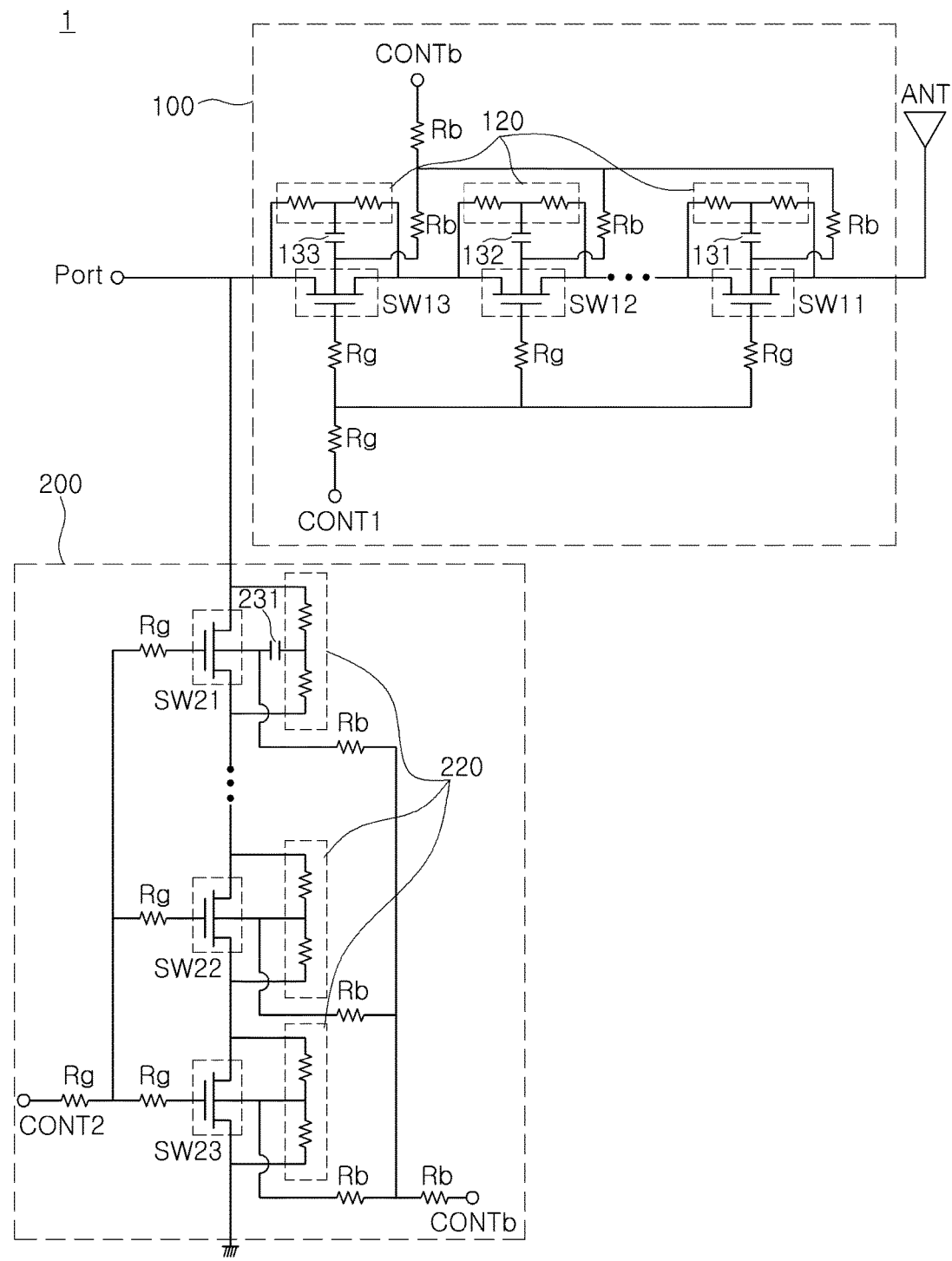
FIGS. 9 and 10 are circuit diagrams illustrating a radio frequency switch circuit including a second switch that is connected to a second impedance unit and a second switch that is not connected to a second impedance unit.
Figure 10:
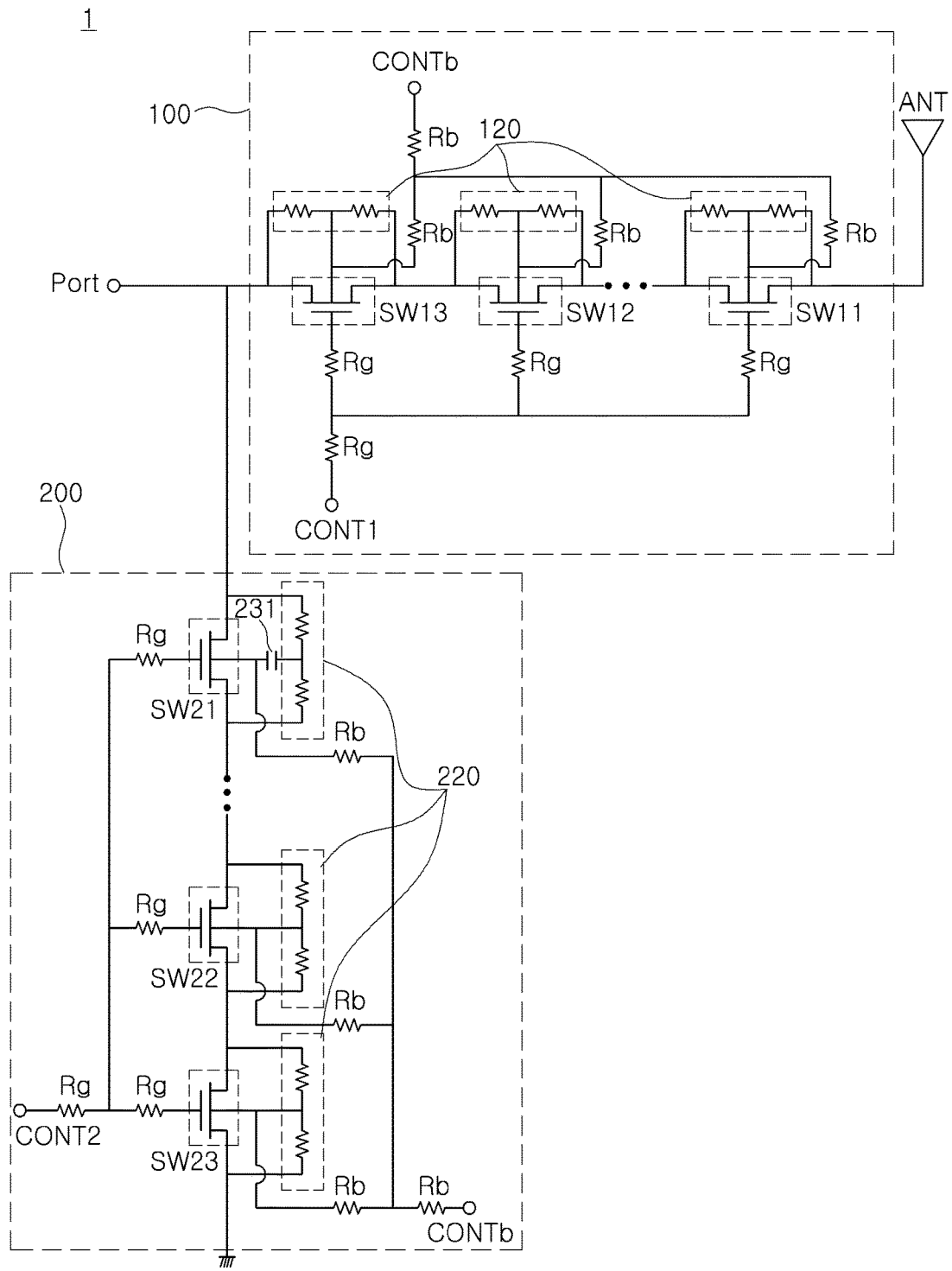

FIGS. 9 and 10 are circuit diagrams illustrating a radio frequency switch circuit including a second switch that is connected to a second impedance unit and a second switch that is not connected to a second impedance unit.

Referring to the example of FIG. 9, the second switch circuit unit 200 may include at least two second switches such as SW21, SW22, and SW23 connected to each other in series. Here, the second impedance units 231, 232, and 233 are connected between a voltage dividing node of the second voltage dividing unit 220 and a body terminal of the second switch SW21 of the at least two second switches SW21, SW22, and SW23.

For example, the second switch circuit unit 200 includes a second switch having a structure similar to that of the first switch illustrated in the example of FIG. 2 and a second switch having a structure similar to that of the first switch illustrated in the example of FIG. 4.

Furthermore, in the second switch circuit unit 200, a ratio of the amount of second switches SW21 that are connected to the second impedance unit and the amount of second switches SW22 and SW23 that are not connected to the second impedance units 231, 232, and 233 is changed depending on the communications standards to be supported by the radio frequency switch circuit 1.

Meanwhile, the second switch SW21 connected to the second impedance unit is provided in a position closer to the signal port as compared with the second switches SW22 and SW23 that are not connected to the second impedance unit. Thus, the linearity characteristics of the radio frequency switch circuit 1 designed in this manner efficiently improves complexity and/or costs of the circuit.

Referring to the example of FIG. 10, the first switch circuit unit 100 does not necessarily require that the first switches SW11, SW12, and SW13 are connected to first impedance units 131, 132, and 133 and the second switch circuit unit 200 includes second switches SW21, SW22, and SW23 connected to second impedance units. That is, in the example of FIG. 10, the first switch circuit unit 100 does not require the presence of the switches connected to the first impedance units 131, 132, and 133.

Figure 11:
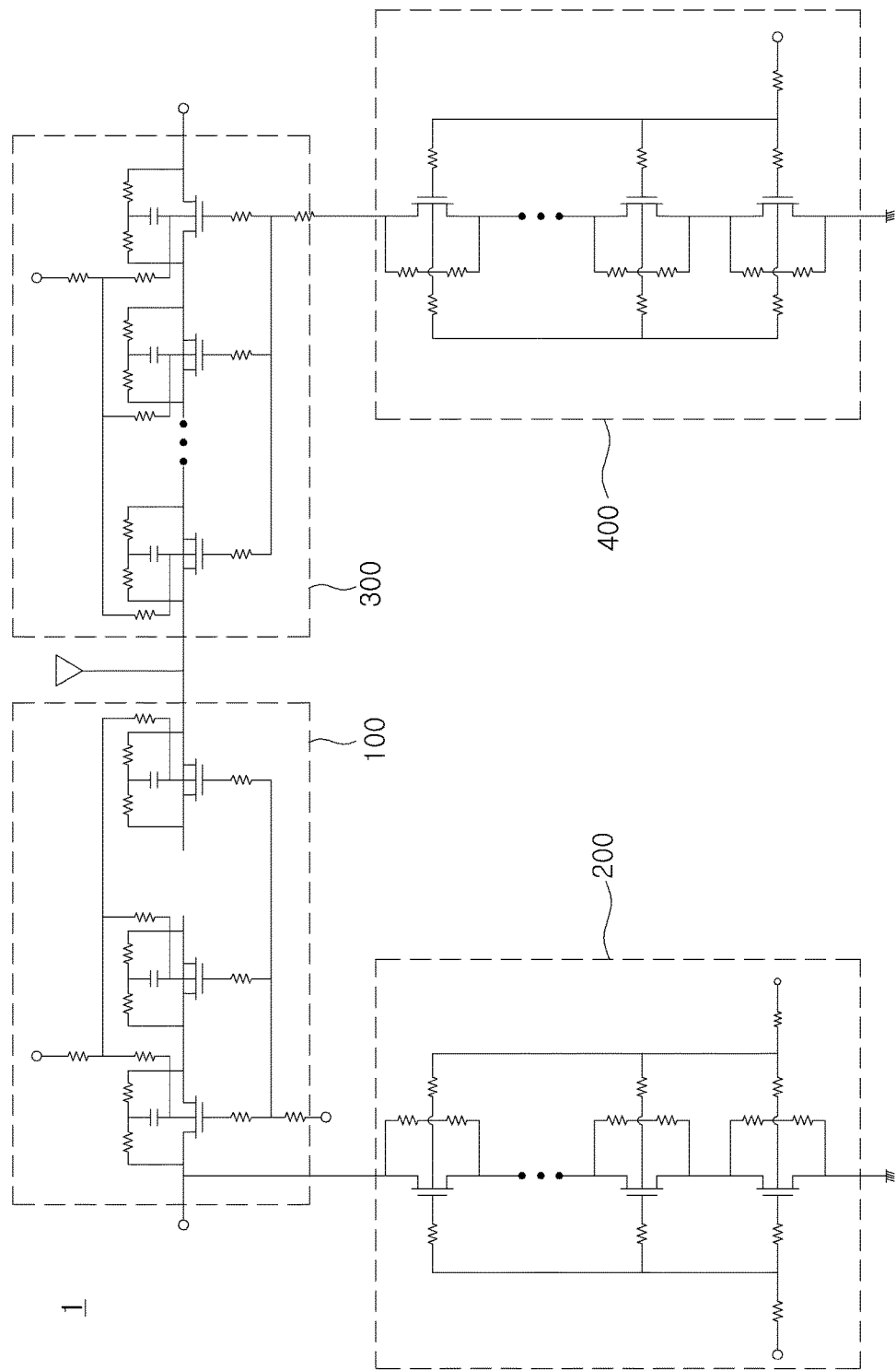
FIGS. 11 to 13 are circuit diagrams illustrating a radio frequency switch circuit including a first switch circuit unit, a second switch circuit unit, a third switch circuit unit, and a fourth switch circuit unit.
Figure 12:
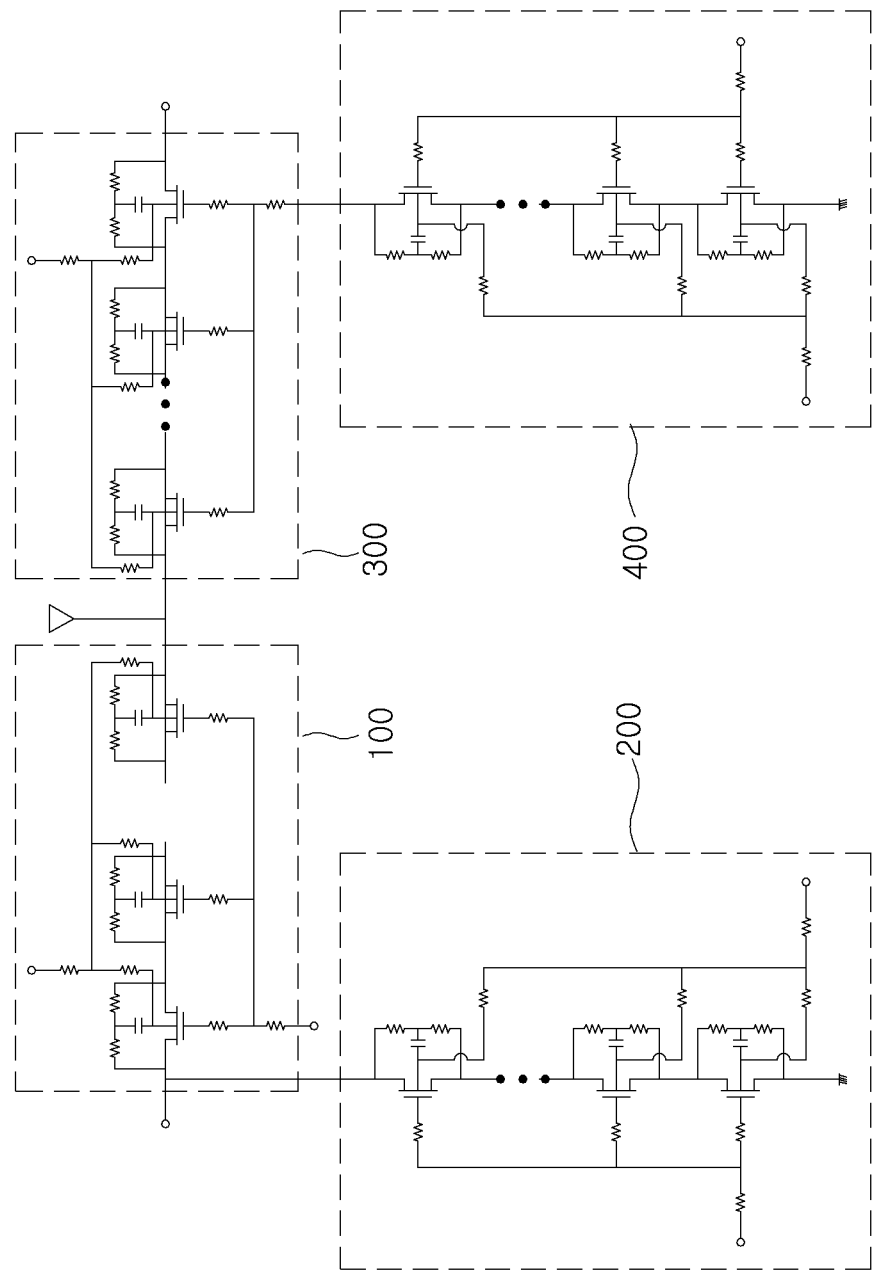
Figure 13:
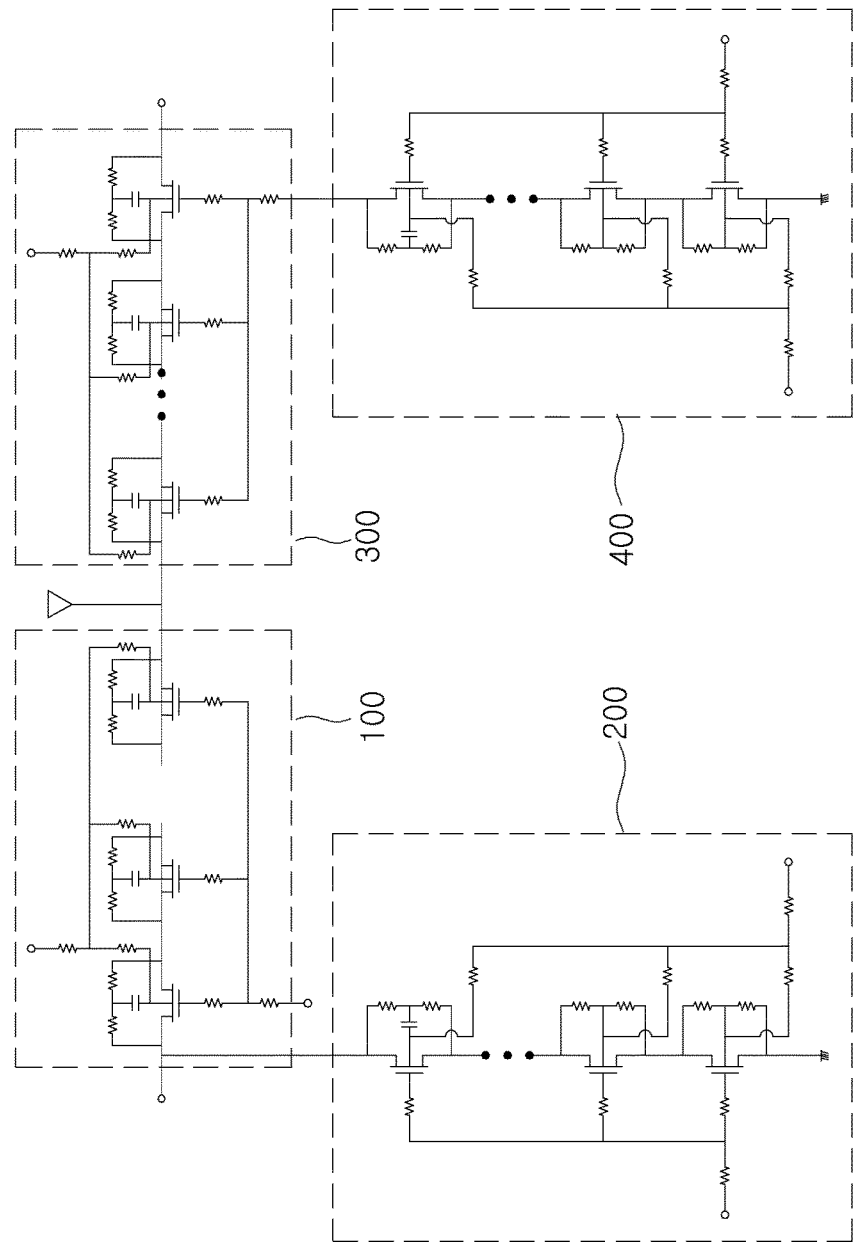

FIGS. 11 to 13 are circuit diagrams illustrating a radio frequency switch circuit including a first switch circuit unit, a second switch circuit unit, a third switch circuit unit, and a fourth switch circuit unit.

Referring to the example of FIG. 11, the radio frequency switch circuit 1 according to an example includes the first switch circuit unit 100, the second switch circuit unit 200, a third switch circuit unit 300, and a fourth switch circuit unit 400. Further, at least one of the first switch circuit unit 100, the second switch circuit unit 200, the third switch circuit unit 300, and the fourth switch circuit unit 400 includes a switching unit, a voltage dividing unit, and an impedance unit.

Meanwhile, the radio frequency switch circuit 1 according to certain examples does not always require four switch circuit units.

For example, the radio frequency switch circuit 1 according to an example, is an SP16T including 16 signal ports and a single antenna port. In this example, the SP16T includes 16 series switch circuit units and further includes 16 shunt switch circuit units. Here, a structure of the series switch circuit unit is similar to that of the first switch circuit unit 100 and a structure of the shunt switch circuit unit is similar to that of the second switch circuit unit 200.

Figure 14:
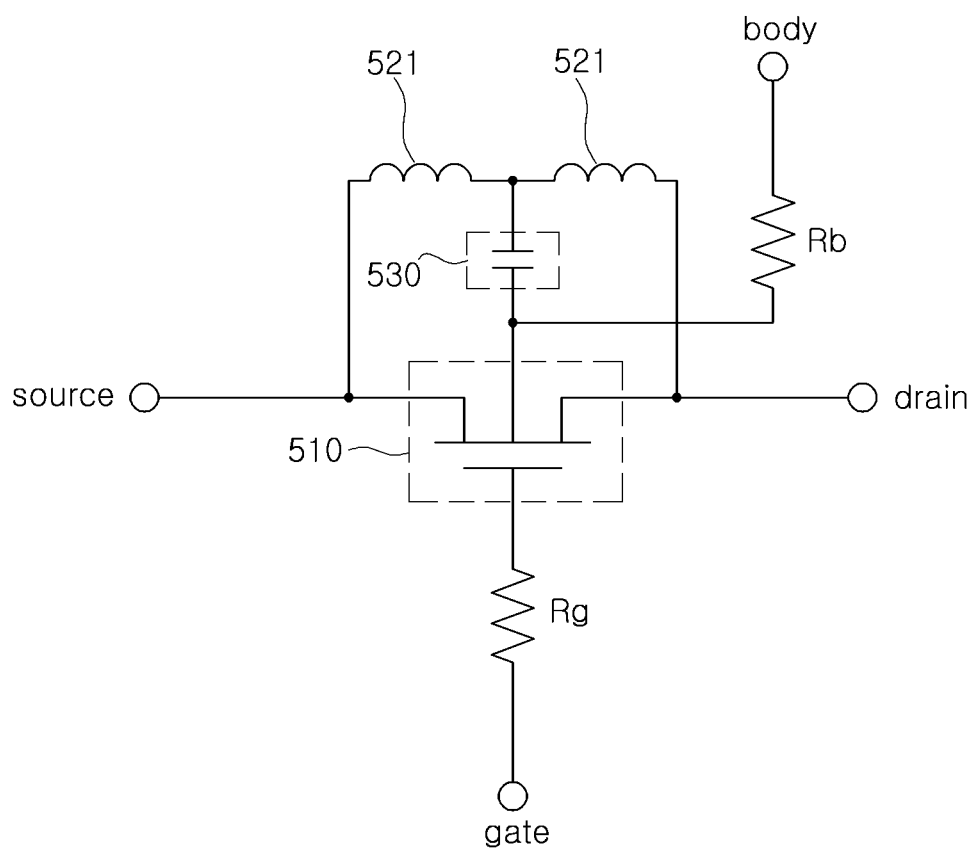
FIG. 14 is a circuit diagram illustrating a radio frequency switch circuit including a first inductor and a second inductor.

FIG. 14 is a circuit diagram illustrating a radio frequency switch circuit including a first inductor and a second inductor.

Referring to the example of FIG. 14, the radio frequency switch circuit according to the example includes a switching unit 510, a first inductor 521, a second inductor 522, and an impedance unit 530.

In this example, the first inductor 521 and the second inductor 522 are connected to each other in series and have different levels of inductance. As a result, a difference in parasitic impedance between a body terminal of the switching unit 510 and two terminals of the switching unit 510 though which a radio frequency signal passes is more accurately compensated for, in consideration of a frequency of the radio frequency signal.

Compared with the first resistor and the second resistor illustrated in the example of FIG. 2, the first inductor 521 and the second inductor 522 generate a resonance along with the impedance unit 530 and decrease power consumption due to the resistance.

Figure 15:
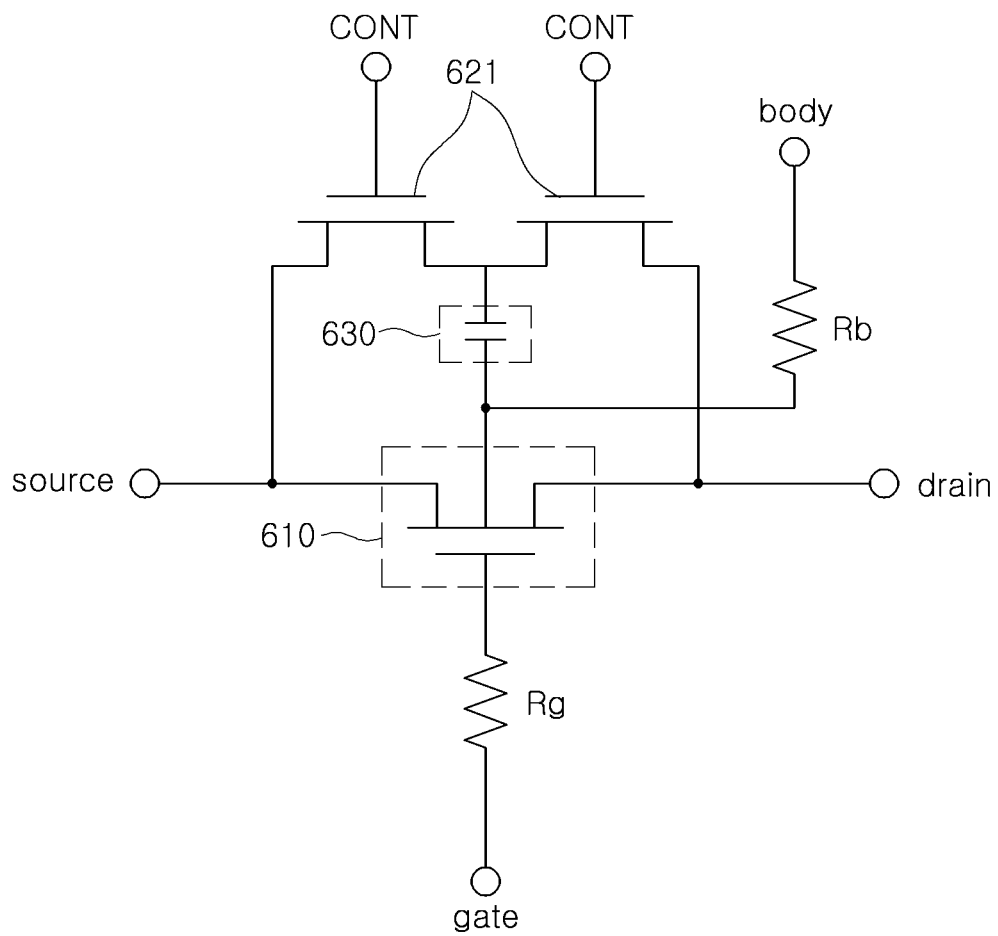
FIG. 15 is a circuit diagram illustrating a radio frequency switch circuit including an impedance variable switch.

FIG. 15 is a circuit diagram illustrating a radio frequency switch circuit including an impedance variable switch.

Referring to the example of FIG. 15, the radio frequency switch circuit according to the example includes a switching unit 610, variable impedance switches 621, and an impedance unit 630.

In this example, the variable impedance switches of the plurality of variable impedance switches 621 are connected to each other in series and have impedance changed by a control signal. As a result, a difference in parasitic impedance between a body terminal of the switching unit 610 and two terminals through which a radio frequency signal from the switching unit 610 passes is more accurately compensated for, depending on an operating environment or a design of the radio frequency switch.

Compared with the first resistor and the second resistor illustrated in the example of FIG. 2, the plurality of impedance variable switches 621 have a high resistance, but use a comparatively small space.

Figure 16A:
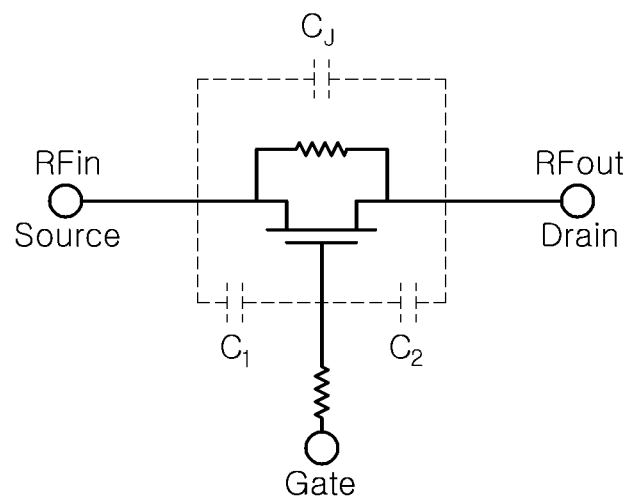
FIGS. 16A and 16B are diagrams illustrating deteriorations in linearity due to parasitic capacitance of a switch that is not connected to an impedance unit among a plurality of switches.
Figure 16B:
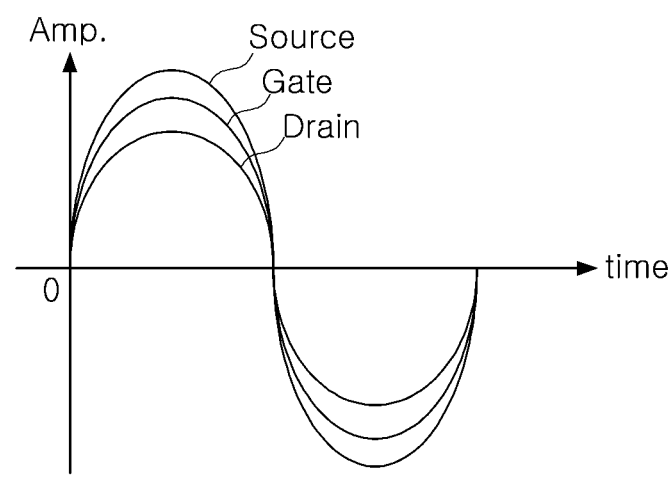

FIGS. 16A and 16B are diagrams illustrating deteriorations in linearity due to parasitic capacitance of a switch that is not connected to an impedance unit among a plurality of switches.

FIG. 16A illustrates the parasitic capacitance of the switch and FIG. 16B illustrates a voltage for each terminal of the switch depending on the parasitic capacitance.

Based on FIGS. 16A and 16B, it can be seen that the linearity may be affected by a parasitic voltage and a parasitic current occurring in each terminal of the switch and a substrate.

Therefore, the radio frequency switch circuit according to the examples lowers a difference between a voltage of a gate and a voltage of a source and a drain to a threshold voltage, thereby decreasing a magnitude of a leakage current. Thus, according to such an approach, it is to be understood that a voltage division of the plurality of switches is made more equally.

Figure 17A:
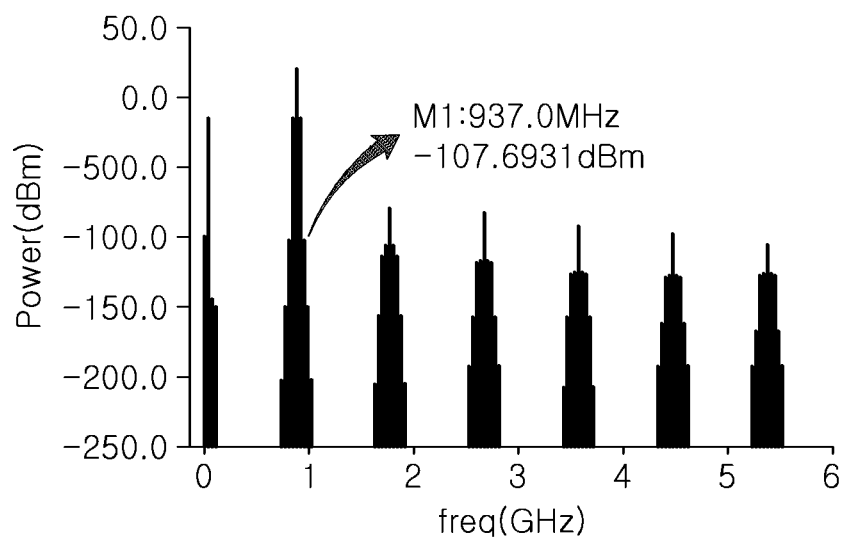
FIGS. 17A and 17B are graphs illustrating the linearity of a radio frequency switch circuit including a switch that is not connected to an impedance unit.
Figure 17B:
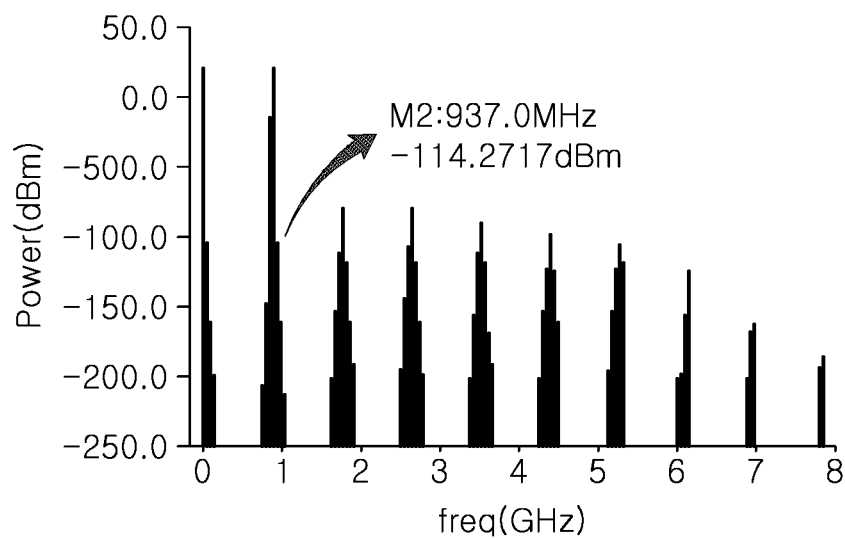

FIGS. 17A and 17B are graphs illustrating the linearity of a radio frequency switch circuit including a switch that is not connected to an impedance unit.

FIG. 17A is a graph illustrating fundamental waves and even harmonics depending on frequency in the SP16T. By using this information, the second inter-modulation distortion (IMD2) is able to be measured. For example, when the frequency of the signal passing through the radio frequency switch is 937 MHz, the IMD2 is −107.6931 dBm.

FIG. 17B is a graph illustrating fundamental waves and odd harmonics depending on frequency in the SP16T. By using this information, the third inter-modulation distortion (IMD3) is able to be measured. For example, when the frequency of the signal passing through the radio frequency switch is 937 MHz, the IMD3 is −114.2717 dBm.

FIGS. 18A and 18B, 19A and 19B, 20A and 20B, 21A and 21B, 22A and 22B, and 23A and 23B are graphs illustrating the linearity of a radio frequency switch circuit according to an example of the present disclosure.

Figure 18A:
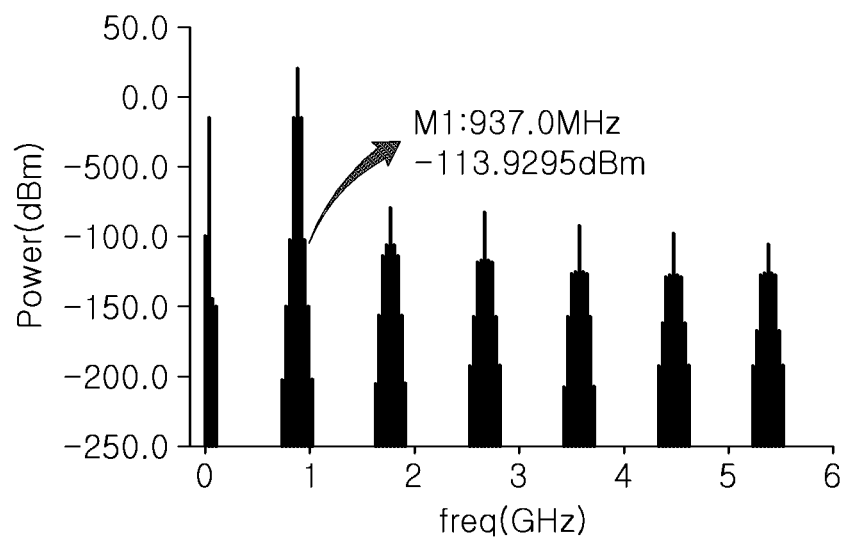
FIGS. 18A and 18B, 19A and 19B, 20A and 20B, 21A and 21B, 22A and 22B, and 23A and 23B are graphs illustrating the linearity of a radio frequency switch circuit according to an example of the present disclosure.
Figure 18B:
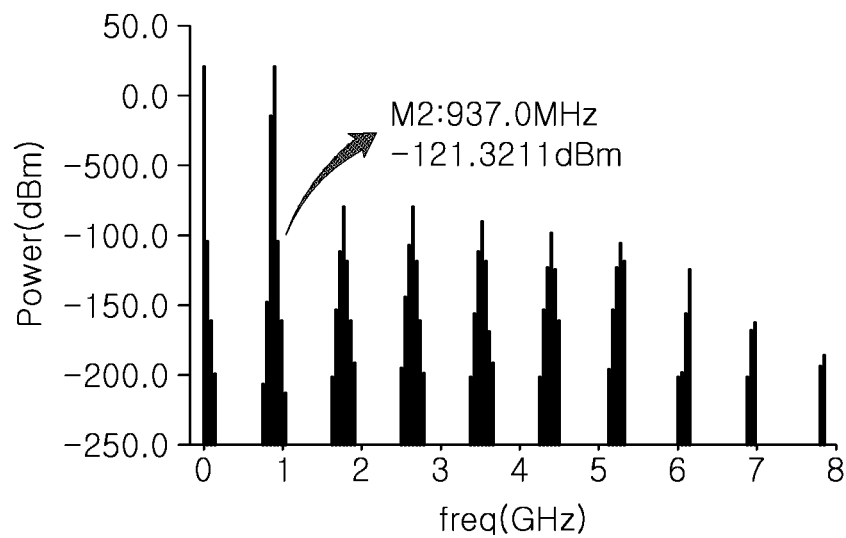

FIG. 18A is a graph illustrating fundamental waves and even harmonics, depending on frequency, when all of the plurality of switches included in the first switching unit are connected to the first impedance unit. In this example, when the frequency of the signal passing through the radio frequency switch is 937 MHz, the IMD2 is −113.9295 dBm. FIG. 18B is a graph illustrating fundamental waves and odd harmonics, depending on frequency, when all of the plurality of switches included in the first switching unit are connected to the first impedance unit. In this example, when the frequency of the signal passing through the radio frequency switch is 937 MHz, the IMD3 is −121.3211 dBm. It is possible to see from these graphs that in the radio frequency switch circuit according to the example, the IMD2 is improved by as much as 6 dB and the IMD3 is improved by as much as 7 dB, compared to alternatives.

Figure 19A:
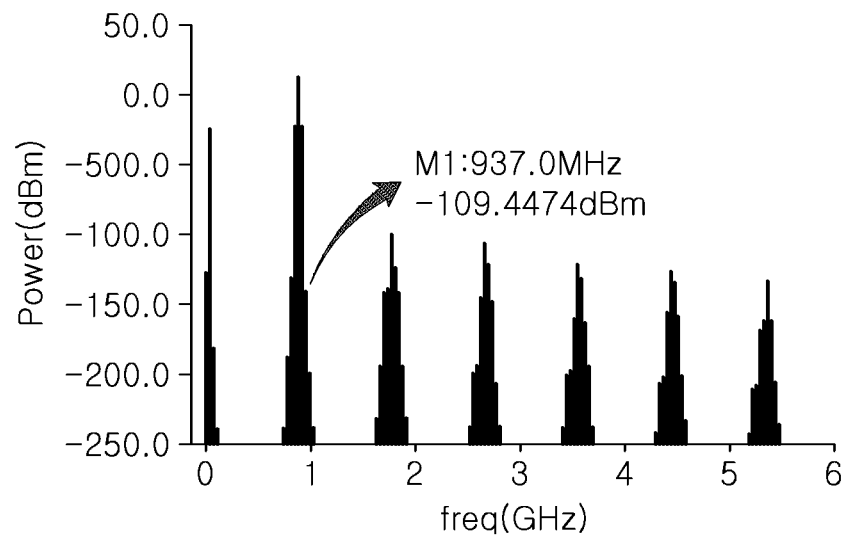
Figure 19B:
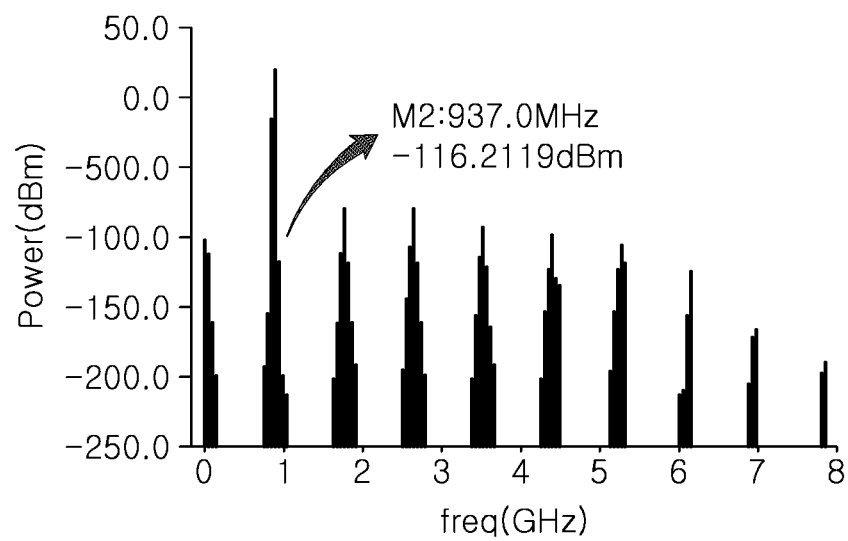

FIG. 19A is a graph illustrating fundamental waves and even harmonics, depending on frequency, when all switches of the plurality of switches included in the second switching unit are connected to the second impedance unit. In this example, when the frequency of the signal passing through the radio frequency switch is 937 MHz, the IMD2 is −109.4474 dBm. FIG. 19B is a graph illustrating fundamental waves and odd harmonics, depending on frequency, when all of the plurality of switches included in the second switching unit are connected to the second impedance unit. In this example, when the frequency of the signal passing through the radio frequency switch is 937 MHz, the IMD3 may be −116.2119 dBm. It is possible to see from these graphs that in the radio frequency switch circuit according to the example, the IMD2 is improved by as much as 2 dB and the IMD3 is improved by as much as 2 dB.

Figure 20A:
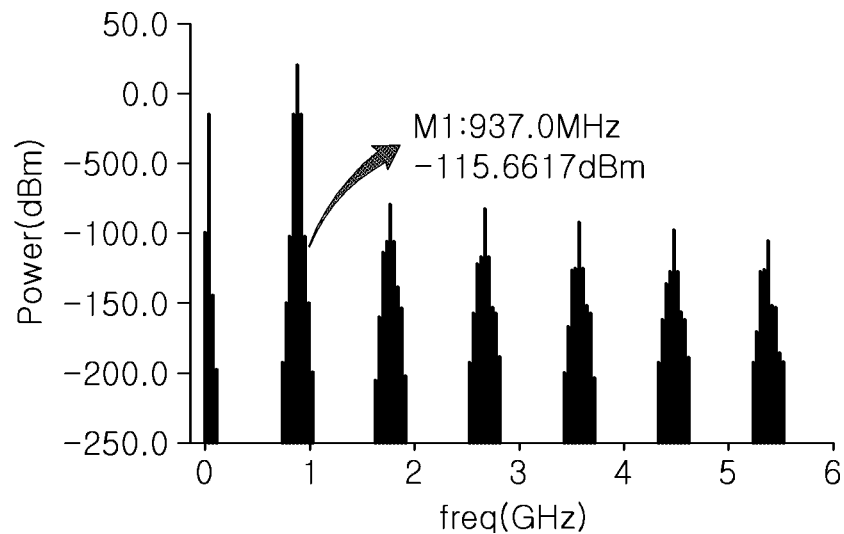
Figure 20B:
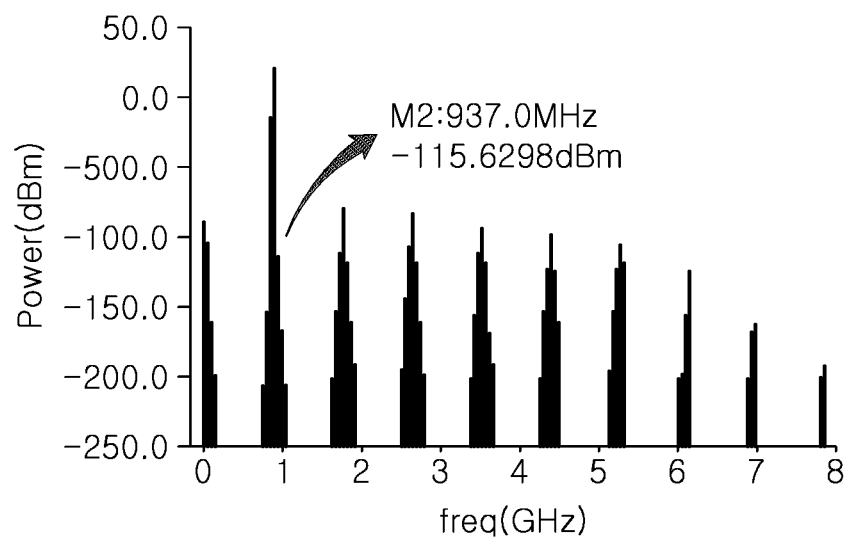

FIG. 20A is a graph illustrating fundamental waves and even harmonics, depending on frequency, when a switch nearest to the antenna port among the plurality of switches included in the first switching unit is connected to the first impedance unit. In this example, when the frequency of the signal passing through the radio frequency switch is 937 MHz, the IMD2 is −115.6617 dBm. FIG. 20B is a graph illustrating fundamental waves and odd harmonics, depending on frequency, when the switch nearest to the antenna port among the plurality of switches included in the first switching unit is connected to the first impedance unit. In this example, when the frequency of the signal passing through the radio frequency switch is 937 MHz, the IMD3 is −115.6298 dBm. It is possible to see from these graphs that in the radio frequency switch circuit according to the example, the IMD2 is improved by as much as 8 dB and the IMD3 is improved by as much as 1 dB.

Figure 21A:
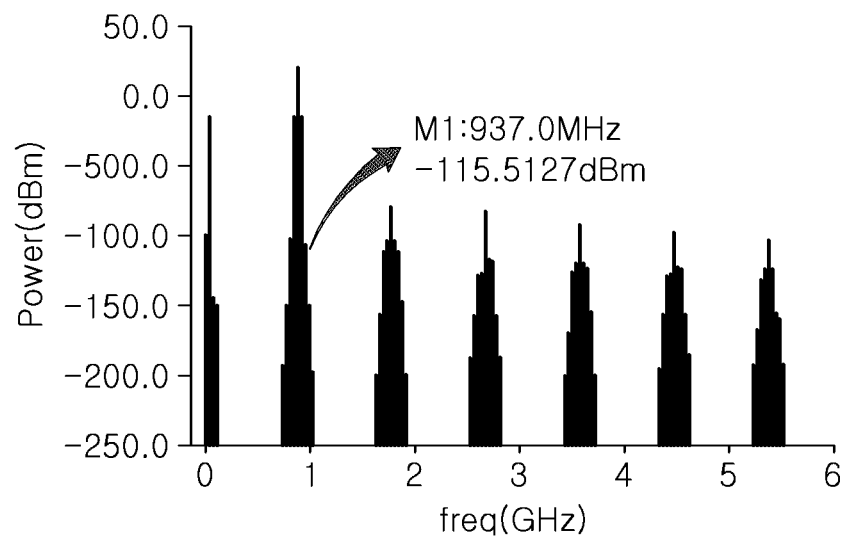
Figure 21B:
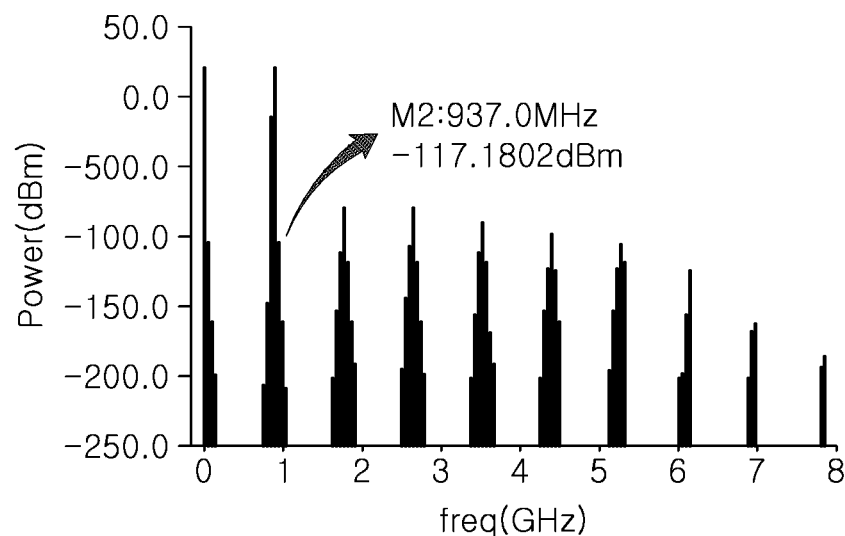

FIG. 21A is a graph illustrating fundamental waves and even harmonics, depending on frequency, when two switches near the antenna port among the plurality of switches included in the first switching unit are connected to the first impedance unit. In this example, when the frequency of the signal passing through the radio frequency switch is 937 MHz, the IMD2 is −115.5127 dBm. FIG. 21B is a graph illustrating fundamental waves and odd harmonics, depending on frequency, when two switches near the antenna port among the plurality of switches included in the first switching unit are connected to the first impedance unit. In this example, when the frequency of the signal passing through the radio frequency switch is 937 MHz, the IMD3 is −117.1802 dBm. It is possible to see from these graphs that in the radio frequency switch circuit according to the example, the IMD2 is improved by as much as 8 dB and the IMD3 is improved by as much as 3 dB.

Figure 22A:
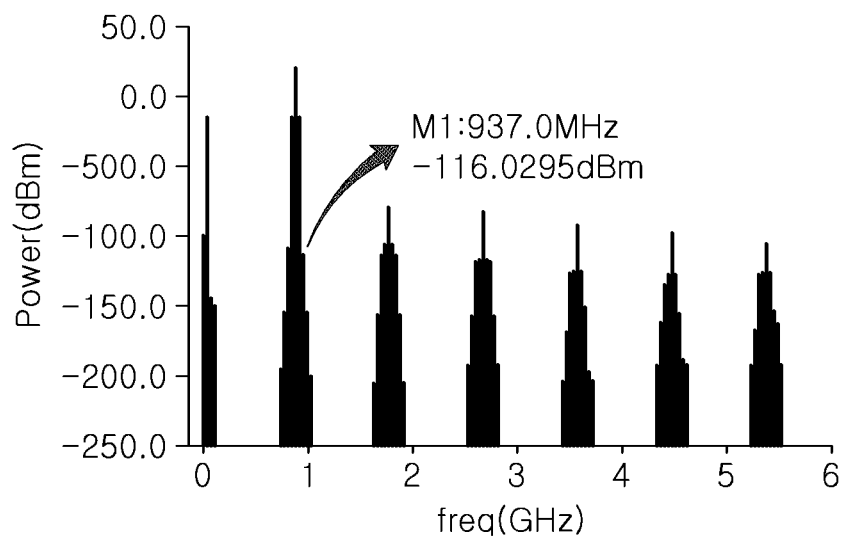
Figure 22B:
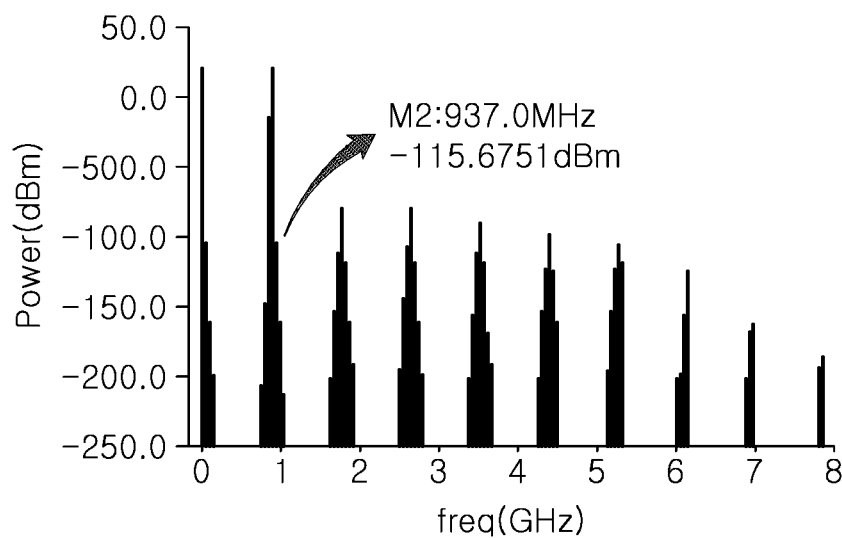

FIG. 22A is a graph illustrating the fundamental wave and the even harmonics, depending on the frequency, when the switch nearest to the antenna port among the plurality of switches included in the first switching unit is connected to the first impedance unit and the switch nearest to the signal port among the plurality of switches included in the second switching unit is connected to the second impedance unit. In this example, when the frequency of the signal passing through the radio frequency switch is 937 MHz, the IMD2 may be −116.0295 dBm. FIG. 22B is a graph illustrating the fundamental wave and the odd harmonics, depending on the frequency, when the switch nearest to the antenna port among the plurality of switches included in the first switching unit is connected to the first impedance unit and the switch nearest to the signal port among the plurality of switches included in the second switching unit is connected to the second impedance unit. In this example, when the frequency of the signal passing through the radio frequency switch is 937 MHz, the IMD3 is −115.6751 dBm. It is possible to see from these graphs that in the radio frequency switch circuit according to the example, the IMD2 is improved by as much as 9 dB and the IMD3 is improved by as much as 1 dB.

Figure 23A:
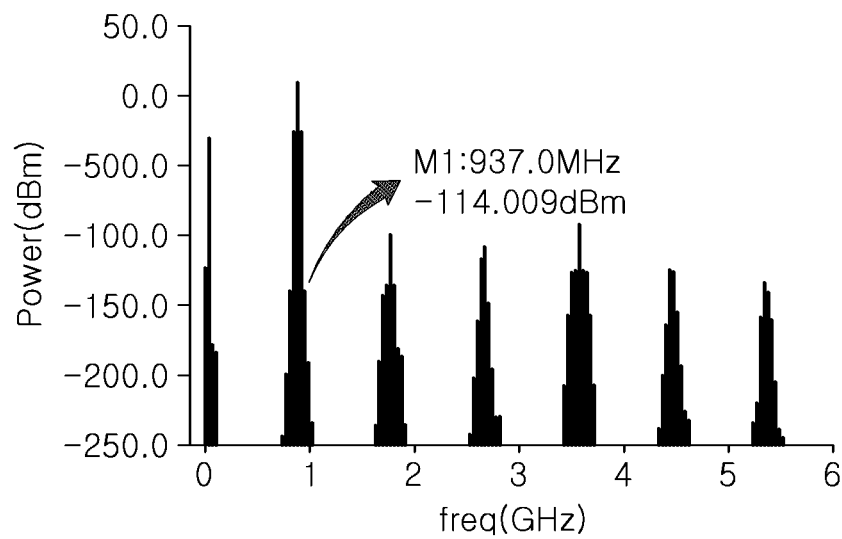
Figure 23B:
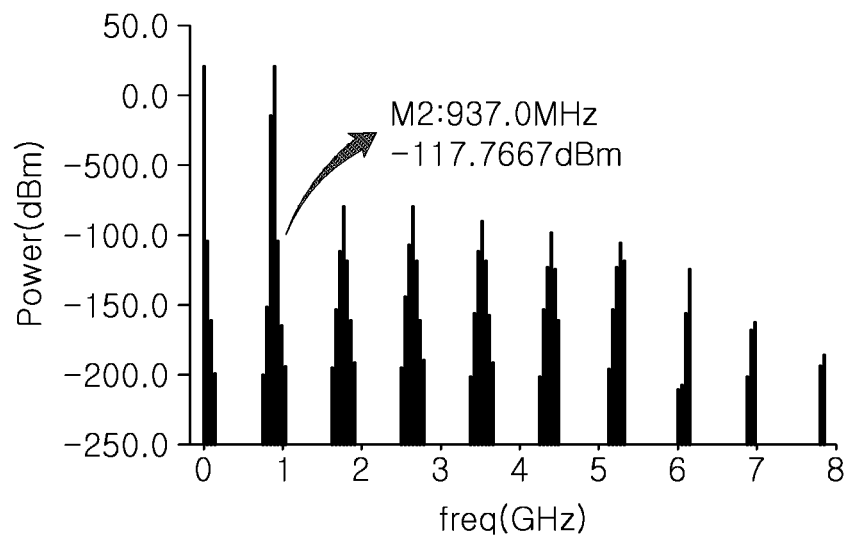

FIG. 23A is a graph illustrating fundamental waves and even harmonics, depending on frequency, when two switches near the antenna port among the plurality of switches included in the first switching unit are connected to the first impedance unit and two switches near the signal port among the plurality of switches included in the second switching unit are connected to the second impedance unit. In this example, when the frequency of the signal passing through the radio frequency switch is 937 MHz, the IMD2 is −114.009 dBm. FIG. 23B is a graph illustrating fundamental waves and odd harmonics, depending on frequency, when two switches near the antenna port among the plurality of switches included in the first switching unit are connected to the first impedance unit and two switches near the signal port among the plurality of switches included in the second switching unit are connected to the second impedance unit. In this example, when the frequency of the signal passing through the radio frequency switch is 937 MHz, the IMD3 is −117.7667 dBm. It is possible to see from these graphs that in the radio frequency switch circuit according to the example, the IMD2 is improved by as much as 7 dB and the IMD3 is improved by as much as 3 dB.

According to the results of the graphs illustrated in FIGS. 18A and 18B, 19A and 19B, 20A and 20B, 21A and 21B, 22A and 22B, and 23A and 23B, it is observable that the IMD2 and the IMD3 potentially conflict with each other. Furthermore, when the switch connected to the first impedance unit in the first switching unit is connected to the first impedance unit near the antenna port or the switch connected to the second impedance unit in the second switching unit is connected to the second impedance unit near the antenna port, it is observable that the IMD2 and the IMD3 are efficiently improved in terms of circuit complexity and/or costs.

Figure 24:
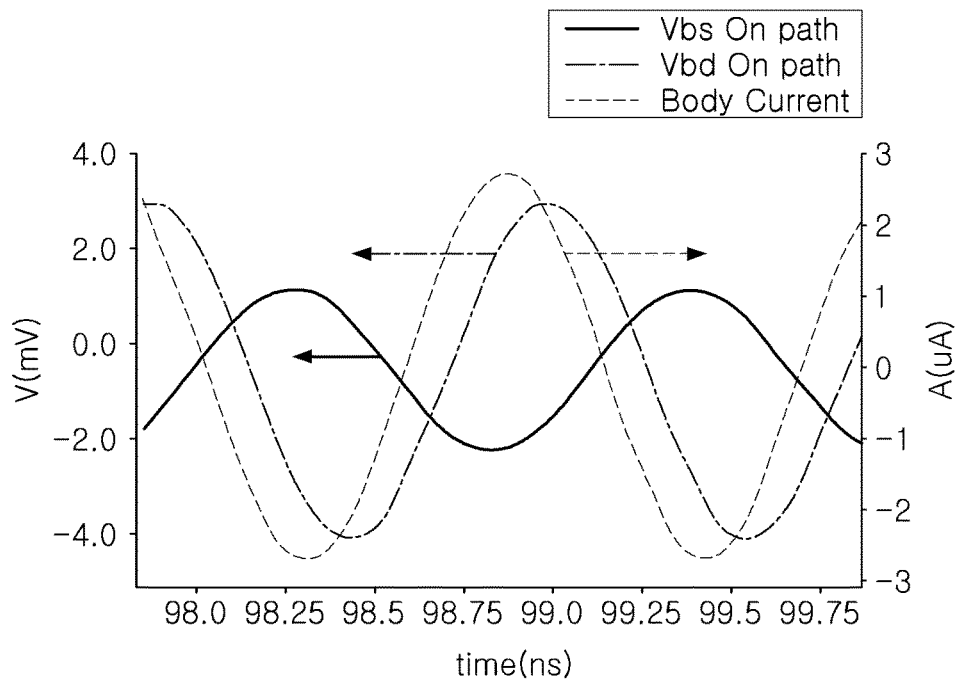
FIG. 24 is a graph illustrating signal characteristics of a radio frequency switch circuit including a switch that is not connected to an impedance unit.

FIG. 24 is a graph illustrating signal characteristics of a radio frequency switch circuit including a switch that is not connected to an impedance unit.

Referring to FIG. 24, a waveform having a low amplitude represents a voltage Vbs between the body terminal of the switch and the source terminal, a waveform having an intermediate amplitude represents a voltage Vbd between the body terminal of the switch and a drain terminal, and a waveform having a high amplitude represents a current of the body terminal of the switch.

In FIG. 24, it is observable seen that a phase difference between Vbs and Vbd is not 180°. This phenomenon occurs because a parasitic component between the body and the source and a parasitic component between the body and the drain are different from each other. Therefore, linearity potentially deteriorates, as a result.

Further, it is observable that the leakage current flowing in the body terminal has a magnitude such that it is measured in microamperes.

Figure 25:
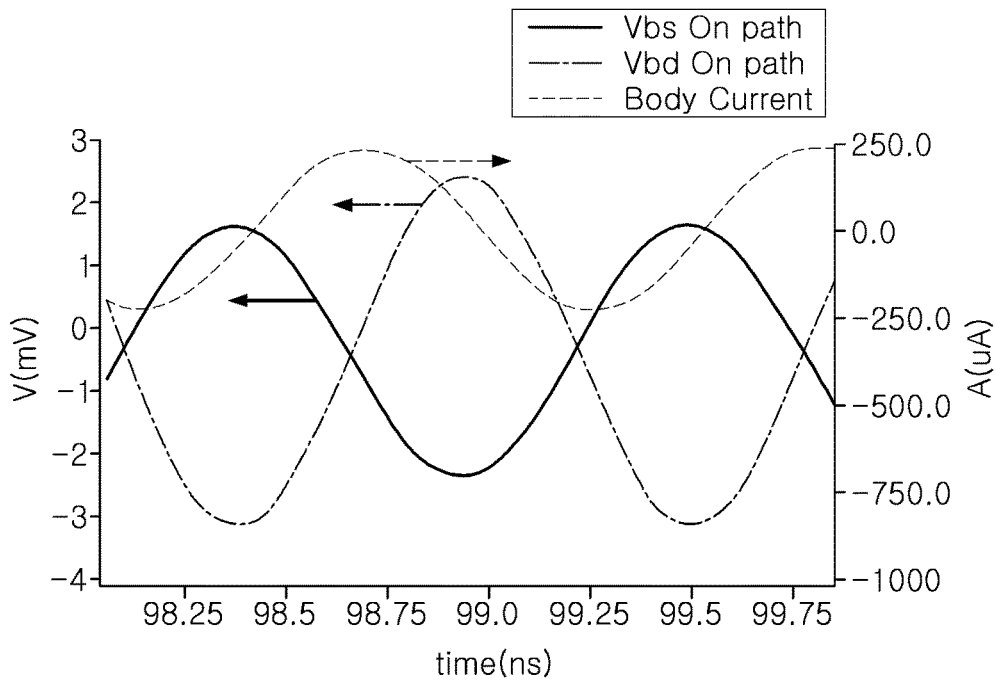
FIG. 25 is a graph illustrating signal characteristics of a radio frequency switch circuit according to an example of the present disclosure.

FIG. 25 is a graph illustrating signal characteristics of a radio frequency switch circuit according to an example of the present disclosure.

Referring to FIG. 25, a waveform having a low amplitude represents a voltage Vbs between the body terminal of the switch and the source terminal, a waveform having a high amplitude represents a voltage Vbd between the body terminal of the switch and a drain terminal, and a waveform disposed at an upper portion represents a current of the body terminal of the switch.

In FIG. 25, it is observable that a phase difference between Vbs and Vbd may be approximately 180°. Further, it is observable that the leakage current flowing in the body terminal has a magnitude such that it is measured in nanoamperes.

As set forth above, according to examples in the present disclosure, a radio frequency switch circuit may be designed to meet various communications standards by improving the linearity characteristics such as the inter-modulation distortion (IMD). Therefore, power efficiency for the radio frequency switch circuit is also improved.

The apparatuses, units, modules, devices, and other components illustrated in FIGS. 1-25 that perform the operations described herein with respect to FIGS. 1-25 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-25. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-25 that perform the operations described herein with respect to FIGS. 1-25 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switch circuit, comprising a first switch circuit connected between a signal port and an antenna port, wherein the first switch circuit comprises:
   a switching circuit controlled to be in a turned on or turned off state based on a gate signal to selectively pass or block a radio frequency signal between a set of terminals of the switching circuit;
   a voltage divider connected to the set of terminals of the switching circuit and being configured to output intermediate voltage between the set of terminals of the switching circuit by a voltage dividing node; and
   a reactance circuit connected between the voltage dividing node and a body terminal of the switching circuit,
   wherein the switching circuit comprises a plurality of first switches connected to each other in series,
   the reactance circuit is connected between the voltage dividing node of the voltage divider and a body terminal of a first switch of the plurality of first switches, and
   the first switch of the plurality of first switches that is connected to the reactance circuit is provided in a position closer to the antenna port as compared to another switch of the plurality of first switches that is not connected to the reactance circuit.

2. The radio frequency switch circuit of claim 1, wherein the voltage divider comprises a first resistor and a second resistor connected to each other in series, and
   the first resistor and the second resistor have different levels of resistance.

3. The radio frequency switch circuit of claim 2, wherein the reactance circuit comprises a body capacitor connected between a node between the first resistor and the second resistor and the body terminal of the switching circuit.

4. The radio frequency switch circuit of claim 1, wherein the first switches comprise:
   field effect transistors (FETs) connected to each other in series through source terminals and drain terminals of the FETs;
   gate resistors connected to gate terminals of the FETs, respectively; and
   body resistors connected to body terminals of the FETs, respectively.

5. The radio frequency switch circuit of claim 1, further comprising a second switch circuit connected between the signal port and a ground and operated by a second gate signal, comprising a second switching circuit,
   wherein the second switching circuit is controlled to be in a turned on or turned off state based on the second gate signal to selectively pass or block the radio frequency signal between a set of terminals of the second switching circuit.

6. The radio frequency switch circuit of claim 5, wherein the second switch circuit further comprises:
   a second voltage divider connected to the set of terminals of the second switching circuit through which the radio frequency signal from the second switching circuit passes
   a second reactance circuit connected between a voltage dividing node of the second voltage divider and a body terminal of the second switching circuit.

7. The radio frequency switch circuit of claim 5, wherein the second switching circuit comprises second switches connected to each other in series, and
   the second switch circuit further comprises:
   a second voltage divider connected between terminals through which the radio frequency signal from the second switches passes
   a second reactance circuit connected between a voltage dividing node of the second voltage divider and a body terminal of a second switch of the second switches.

8. The radio frequency switch circuit of claim 1, wherein the reactance circuit is further configured to compensate for a parasitic impedance difference between the body terminal of the switching circuit and the set of terminals which pass the radio frequency through the switching circuit.

9. A radio frequency switch circuit, comprising:
   a first switch circuit connected between a signal port and an antenna port and operated by a first gate signal; and
   a second switch circuit connected between the signal port and a ground and operated by a second gate signal,
   wherein the second switch circuit comprises:
   a second switching circuit controlled to be in a turned on or turned off state based on the second gate signal to selectively pass or block a radio frequency signal between a set of terminals thereof
   a second voltage divider connected to the set of terminals of the second switching circuit and outputting intermediate voltage between the set of terminals by a voltage dividing node, and
   a second reactance circuit connected between the voltage dividing node and a body terminal of the second switching circuit, the second reactance circuit configured to compensate for a difference in impedance,
   wherein the second switching circuit comprises a plurality of second switches connected to each other in series,
   the second reactance circuit is connected between the voltage dividing node of the second voltage divider and a body terminal of a second switch of the plurality of second switches, and
   the second switch of the plurality of second switches that is connected to the second reactance circuit is provided in a position closer to the signal port as compared with another switch of the plurality of second switches that is not connected to the second reactance circuit.

10. The radio frequency switch circuit of claim 9, wherein the second voltage divider comprises a first inductor and a second inductor connected to each other in series and having different levels of inductance, and
   the second reactance circuit comprises a body capacitor connected between a node between the first inductor and the second inductor and the body terminal of the second switching circuit.

11. The radio frequency switch circuit of claim 9, wherein the first switches comprise:
   field effect transistors (FETs) connected to each other in series through source terminals and drain terminals of the FETs;

gate resistors connected to gate terminals of the FETs, respectively; and body resistors connected to body terminals of the FETs, respectively.

12. The radio frequency switch circuit of claim 9, wherein the second voltage divider comprises variable impedance switches connected to each other in series and having levels of impedance changed by a control signal, and the second reactance circuit comprises a body capacitor connected between a node between the variable impedance switches and the body terminal of the switching circuit.

\* \* \* \* \*